(12) United States Patent
Dorner et al.

(10) Patent No.: US 10,914,772 B2
(45) Date of Patent: Feb. 9, 2021

(54) PHASE MEASUREMENT

(71) Applicant: SOCIONEXT INC., Yokohama (JP)

(72) Inventors: Albert Hubert Dorner, Lahr (DE); Martin Wahle, Dieburg (DE)

(73) Assignee: SOCIONEXT INC., Yokohama (JP)

( * ) Notice: Subject to any disclaimer, the term of this patent is extended or adjusted under 35 U.S.C. 154(b) by 336 days.

(21) Appl. No.: 16/002,373

(22) Filed: Jun. 7, 2018

(65) Prior Publication Data
US 2019/0033355 A1  Jan. 31, 2019

(30) Foreign Application Priority Data

Jul. 25, 2017 (EP) .................................. 17183123

(51) Int. Cl.
| | | |
|---|---|---|
| *G01R 25/08* | (2006.01) | |
| *H03K 5/14* | (2014.01) | |
| *H03K 5/26* | (2006.01) | |
| *H03L 7/085* | (2006.01) | |
| *G01R 25/00* | (2006.01) | |
| *H03L 7/22* | (2006.01) | |
| *H03L 7/08* | (2006.01) | |
| *H03K 5/00* | (2006.01) | |

(52) U.S. Cl.
CPC ............. *G01R 25/08* (2013.01); *G01R 25/00* (2013.01); *H03K 5/14* (2013.01); *H03K 5/26* (2013.01); *H03L 7/08* (2013.01); *H03L 7/085* (2013.01); *H03L 7/22* (2013.01); *H03K 2005/00078* (2013.01)

(58) Field of Classification Search
CPC ..................... G01R 25/00; G01R 25/08; H03K 2005/00078; H03K 5/14; H03K 5/26; H03L 7/08; H03L 7/085; H03L 7/22

USPC ............. 702/79; 327/12, 156, 170; 331/1 A; 369/47.32; 375/147, 324

See application file for complete search history.

(56) References Cited

U.S. PATENT DOCUMENTS

| | | | | |
|---|---|---|---|---|
| 5,612,938 A | * | 3/1997 | Dohmeier | ........ G11B 20/10009 360/51 |
| 5,708,395 A | * | 1/1998 | Yamauchi | ............. H03L 7/0991 327/107 |
| 6,429,693 B1 | | 8/2002 | Staszewski et al. | |

(Continued)

OTHER PUBLICATIONS

Extended European Search Report, European Patent Application No. 17183123.3 dated Jan. 18, 2018.

*Primary Examiner* — John H Le
(74) *Attorney, Agent, or Firm* — Arent Fox LLP

(57) ABSTRACT

The present disclosure relates to phase measurement circuitry operable based on a first clock signal having an intended clock frequency F1 and a second clock signal having an intended clock frequency F2, the circuitry comprising: a delay line configured to receive the first clock signal, the delay line comprising a plurality of delay units each configured to cause a propagation delay, and the plurality of delay units connected in series along the length of the delay line and defining a series of positions therebetween through which signal edges of the first clock signal propagate over time; an edge detector configured to sample the delay line at successive sample times based on the second clock signal and to record at each sample time the position of a given signal edge of the first clock signal along the delay line; and a phase angle determiner configured to determine a phase angle per delay unit based on successive recorded said positions.

15 Claims, 15 Drawing Sheets

(56) References Cited

U.S. PATENT DOCUMENTS

2006/0238240 A1* 10/2006 Bogdan ................ H04L 7/0087
329/324
2012/0049912 A1  3/2012 Yoshida et al.
2015/0131706 A1  5/2015 Gough

* cited by examiner

| POSITIONS | PHASE ANGLE |
|---|---|
| 94 | 338.4° |
| 82 | 295.2° |
| 69 | 248.4° |
| 57 | 205.2° |
| 44 | 158.4° |
| 32 | 115.2° |
| 19 | 68.4° |
| 7 | 25.2° |
| 94 | 338.4° |
| 82 | 295.2° |

FIG. 12

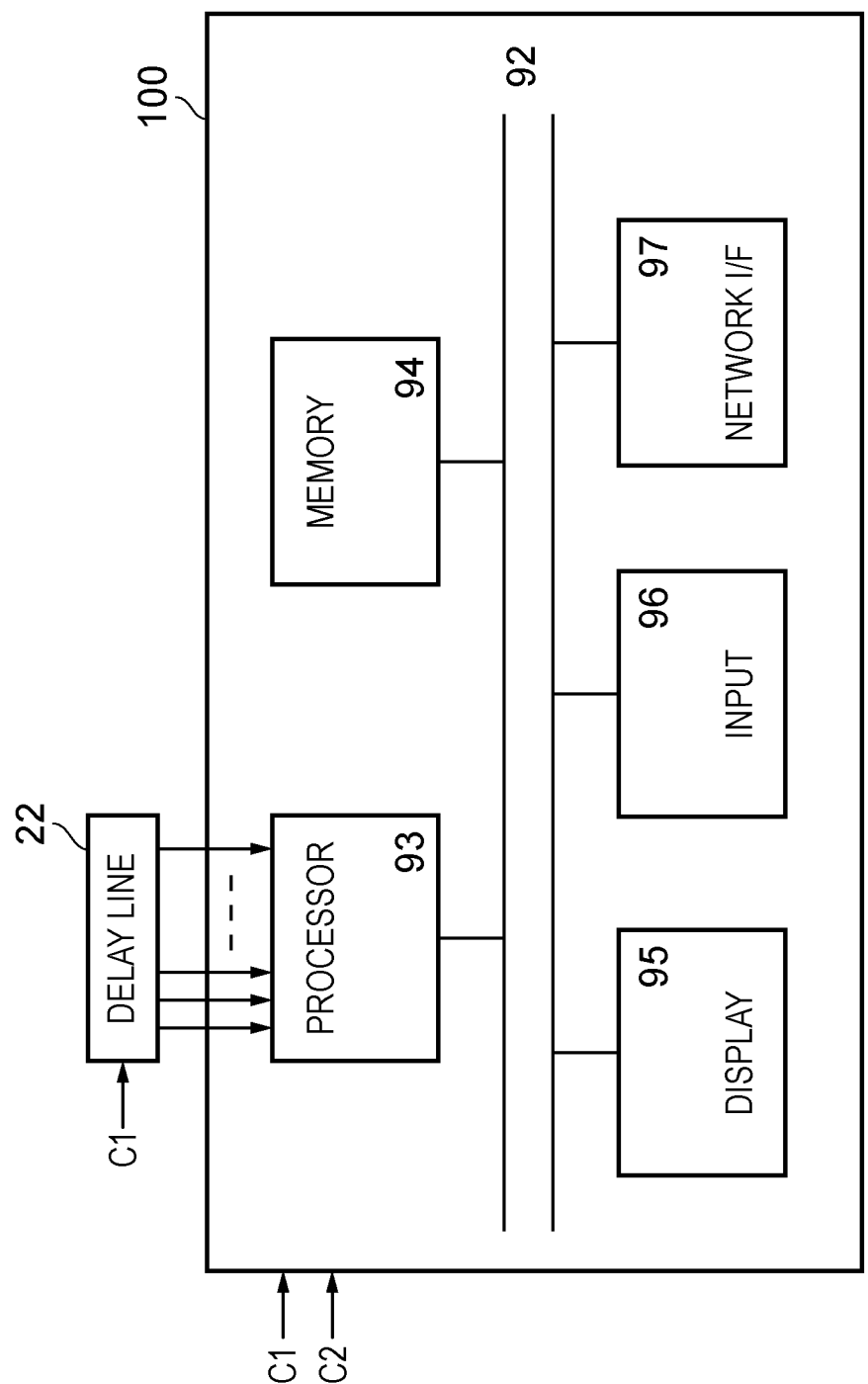

PHASE MEASUREMENT

CROSS-REFERENCE TO RELATED APPLICATIONS

This application claims priority from European Patent Application No. 17183123.3 filed Jul. 25, 2017. The entire contents of this application is incorporated herein by reference.

The present invention relates to phase measurement and phase detection, and in particular to circuitry operable to determine phase information based on first and second clock signals. Such phase measurement may be relative phase measurement, for example relating to the phase of one such clock signal relative to the other. The present invention also relates to methods performed by such circuitry and corresponding computer programs.

It will be appreciated that parts of such circuitry may be implemented as software (e.g. computer programs) running on hardware (e.g. a computer or processor). One example application of such circuitry is in a phase detector, as may be used to detect a phase relationship between the first and second clock signals. Such a phase detector may be employed within a phase-locked or phase lock loop (PLL), with the first and second clock signals being the reference and feedback clock signals of the PLL, respectively.

As another example, such a phase detector may be employed to control the phase relationship between a first data processing system operating based on the first clock signal and a second data processing system operating based on the second clock signal. The first data processing system may for example output data to the second processing system, leading to a desire to maintain a phase relationship between the first and second clock signals (i.e., maintain them at their intended clock frequencies). It may be that a FIFO (First-In-First-Out) buffer is provided on the data path between the first and second data processing systems, to effectively absorb a data bottleneck when there is a phase error between the first and second clock signals. It would be advantageous to measure such phase errors accurately so as to be able to control e.g. the second clock signal to reduce the phase error. The more reliable/accurate this is, the smaller the size of the FIFO that would need to be provided.

Continuing this example, the first and second data processing systems may correspond to different functional blocks (e.g., demodulation, error correction or modulation), requiring different clock frequencies. The frequencies however typically have an integer ratio m/n. The ratio m/n may vary depending on the mode or application from small numbers such as 4/3 up to values which are in the range of several thousands. In addition it may be important to reduce the frequency to a minimum to optimise power and size. Therefore, clock gating is typically not an option.

To better understand the present example, FIG. 1 is a schematic diagram of a previously-considered data-processing system 1.

System 1 comprises a first data processing module 2, a FIFO buffer 4 and a second data processing module 6. As a simple example which will be returned to later, the data processing module 2 is operable to receive 8 bytes of data based on a first clock signal C1 having a frequency F1=800 MHz, so as to process 8 bytes of data in a given operation period. During such an operation period, the first data processing module 2 then outputs 7 bytes of data which are transmitted via the FIFO buffer 4 to the second data processing module 6. The second data processing module 6 in this example is operable to receive 7 bytes of data based on a second clock signal C2 having a frequency F2=700 MHz, so as to process 7 bytes of data in such an operation period. Therefore, if the clock frequencies F1 and F2 are as intended, the level of data in the FIFO buffer 4 can be maintained at a steady state (for example, the FIFO buffer 4 may even not be necessary). If the frequencies F1 and F2 are subject to a small degree of error over time, a relatively small FIFO buffer 4 may be sufficient to absorb corresponding changes in the amount of data held in that buffer. However, if the frequencies F1 and F2 are subject to a high degree of error over time, a relatively large FIFO buffer 4 may be necessary (or even that may not be sufficient). Thus, it is desirable to keep clocks C1 and C2 under control.

The first clock signal C1 is supplied by a first PLL 8 and the second clock signal C2 is supplied by a second PLL 10. To track clock signals C1 and C2 they are divided by integers m and n, in clock dividers 12 and 14 respectively, to result in a common frequency. In this example, m=8 and n=7, such that the common frequency is 100 MHz. Those two clocks are then compared by edge comparator 16 to produce an error signal which is fed into a loop filter 18 to produce a frequency control signal which is used to control the second PLL 10 so that the frequencies F1 and F2 (of the clock signals C1 and C2) are maintained in the intended relationship.

The FIG. 1 architecture however has disadvantages. Firstly, the update rate gets very small if m and n are big numbers. In that case the error between two measurements can get big and the system may become unstable. Another problem is the phase measurement itself. If the phase comparator is built in analogue circuitry, it is difficult to realise if the frequency is low. If it is built in digital circuitry, it is generally not easy to measure the phase difference. For example, it may be that only faster/slower information can be generated unless complex circuitry is employed. This would then lead to a bang-bang type of control loop and corresponding well known disadvantages.

If a digital TDC (time-to-digital-converter) is used to measure the phase difference, typical implementations require a calibration process for the delay line to get correct results. Process, temperature and voltage (PTV) variations are also a problem. Another possibility would be the use of a DLL (Delay-Locked Loop) to generate stable phase information of the measured clock. Both options are complicated to implement and require significant power.

With previously-considered circuitry, it has been found that measurement of the phase difference between two frequencies in a digital way using delay lines requires a calibration process/procedure. If the two clocks have an integer ratio with a low common frequency, it has been found difficult to measure with a high sampling rate the phase error between the two clocks.

Against this backdrop, it is desirable to address some or all of the above problems.

According to an embodiment of a first aspect of the present invention, there is provided phase measurement circuitry operable based on a first clock signal having an intended clock frequency F1 and a second clock signal having an intended clock frequency F2, the circuitry comprising: a delay line configured to receive the first clock signal, the delay line comprising a plurality of delay units each configured to cause a propagation delay, and the plurality of delay units connected in series along the length of the delay line and defining a series of positions therebetween through which signal edges of the first clock signal propagate over time; an edge detector configured to sample the delay line at successive sample times based on the second clock signal and to record at each sample time the position of a given signal edge of the first clock signal along the delay line; and a phase angle determiner configured to determine a phase angle per delay unit based on successive recorded said positions.

In this way, a measurement of the speed (propagation delay) of the delay units may be obtained. Such a measurement may be relative to the first clock signal, for example to its period. Thus, changes in the speed of the delay units (and thus the delay line) e.g. due to PTV variations may be picked up by repeated such measurements.

It may be that F1 is different from F2, however F1 and F2 may also be the same as one another. Integer and integer-plus-fraction ratios F1:F2 are envisaged. The positions may be discrete positions, such as nodes between the delay units. As will become apparent, the phase angle determiner may be configured to determine the phase angle per delay unit based on just two successive recorded said positions, although in some arrangements a larger number of successive recorded said positions may be taken into account.

The delay units may be any circuits which cause a propagation delay, such as CMOS inverters or other CMOS logic gates.

The given signal edge may be a rising edge. The given signal edge may be the first rising edge which appears along the length of the delay line from the end of the delay line where the first clock signal is received. As an alternative, the given signal edge may be a falling edge. The given signal edge may be the first falling edge which appears along the length of the delay line from the end of the delay line where the first clock signal is received. Signal edges towards the end of the delay line where the first clock signal is received may suffer minimal degradation.

The delay line may be configured to provide a given propagation delay between consecutive said positions. The delay units may be configured to provide substantially the same propagation delay as one another. This may lead to a desirable linear response of the delay line.

The delay line may be configured so that its propagation delay is at least as long as an intended period P1 of the first clock signal, bearing in mind that the intended period P1 may take a range of values due to PTV and frequency changes. Effectively, the delay line may be configured so that its propagation delay is at least as long as the upper end of such a range of P1 values.

The delay line may be configured so that its propagation delay is not as long as at least as long as 2 times the upper end of such a range of P1 values, or optionally 1.5 times or 1.2 times or 1.1 times the upper end of such a range of P1 values.

For example, the delay line may be configured so that its propagation delay is at least as long as an intended period P1 of the first clock signal or the upper end of a given (expected/designed) range of values of the period P1, and optionally shorter than 2 times the intended period P1 or the upper end of the given range of values of the period P1.

Thus, embodiments do not need for example to ensure that at least two periods P1 fit into the delay line. It is advantageous not to need too long a delay line, given signal degradation along its length. It is also advantageous to use the same delay units to measure the phase angle per delay unit as may be used to measure the (relative) phase position of the first clock signal, as will become apparent. Any errors relating to the delay units affect both types of measurement in the same way, so there is common-mode error rejection.

Of course, if the delay line were configured so that its propagation delay is at least e.g. four times as long as the upper end of such a range of P1 values, the circuitry would still work. However, in that case more circuit area is needed.

The edge detector may be configured to sample the delay line every X cycles of the second clock signal. X may be an integer. For example, X may be set so that (except where F1 equals F2 or is a multiple of F2): (X*F1)/F2 gives an integer plus fraction result, the fraction of the result indicating a corresponding fraction of a full phase revolution of the first clock signal by which the phase of the first clock signal is expected to advance every X cycles of the second clock signal, the fraction of the full phase revolution of the first clock signal and its complement constituting complementary major and minor portions of the full phase revolution of the first clock signal; and the fraction of the result is sufficiently larger than 0.5 or sufficiently smaller than 0.5 such that the successive recorded positions follow a repeating pattern, the pattern which repeats comprising the successive recorded positions stepping along the delay line in a given direction in at least 3 relatively-small steps and then returning in the opposite direction via a single relatively-large step, each step traversing consecutive said delay units.

Instead of at least 3, at least 4, or 5 or 6 or 7 or 8 or 9 or 10 etc. is envisaged. Put another way, the fraction of the result may preferably be <0.2 or >0.8. Here, traversing effectively corresponds to transition between the two corresponding positions appearing to pass over or bridge consecutive said delay units.

As an aside, where F1 equals F2, such that (X*F1)/F2 would give an integer result, i.e. with no fraction, then as soon as there is an error in the ratio F1:F2, there would be a fraction part of the result which would be picked up. Similarly, where F1 is a multiple of F2, such that (X*F1)/F2 would give an integer-plus-0.5 or integer result, then as soon as there is an error in the ratio F1:F2, there could be a fraction part (e.g. satisfying <0.2 or >0.8 given a suitable value of X).

For the or each relatively-large step, the propagation delay caused by the number of delay units traversed by that step corresponds to the major portion of the full phase revolution of the first clock signal, and the phase angle determiner may be configured to determine, for the or each relatively-large step, said phase angle per delay unit based on the phase angle corresponding to that major portion and the number of said delay units traversed by that step. Using the relatively-large step may increase accuracy as explained in more detail later.

For the or each relatively-small step, the propagation delay caused by the number of delay units traversed by that step corresponds to the minor portion of the full phase revolution of the first clock signal, and the phase angle determiner may be configured to determine, for the or each relatively-small step, said phase angle per delay unit based on the phase angle corresponding to that minor portion and the number of said delay units traversed by that step. Using a relatively-small step may give acceptable results in some implementations.

The phase angle determiner may be configured to determine the phase angle per delay unit based on the number of delay units making up each of a series of such (relatively-large or relatively-small) steps. For example, the phase angle determiner may be configured to determine said phase angle per delay unit based on an average (e.g. a running average) of the number of said delay units making up each of a series of such steps.

The phase angle determiner may comprise a period determiner configured to determine a representative number representative of the period of the first clock signal based on the successive recorded positions, the representative number being the number of said delay units which collectively provide a propagation delay corresponding to that period.

The period determiner may be configured to determine the representative number based on, for one or more of the relatively-large steps, the number of delay units traversed by that step. Similarly, the period determiner may be configured to determine the representative number based on, for one or more of the relatively-small steps, the number of delay units traversed by that step.

The period determiner may be configured to determine the representative number by proportionally scaling up the number of delay units making up that (relatively-large or relatively-small) step to correspond to the sum of the major and minor portions.

The period determiner may be configured to determine the representative number based on a series of such scaled up numbers corresponding to a series of such (relatively-large or relatively-small) steps. For example, the period determiner may be configured to determine the representative number based on an average (e.g. a running or moving average) of said series of scaled up numbers.

The phase angle determiner may be configured to determine the phase angle per delay unit based on said representative number.

The phase measurement circuitry may comprise a measured phase relationship determiner configured to determine a measured phase relationship between the first and second clock signals at each of a series of said sample times based on the corresponding recorded positions and the phase angle per delay unit. For example, a recorded position (i.e. number of delay units) may be multiplied by the phase angle per delay unit to arrive at a measured phase relationship.

The phase measurement circuitry may comprise a target phase relationship determiner configured to determine a target phase relationship between the first and second clock signals at each of the or a series of sample times, based on those sample times, F1 and F2.

The phase measurement circuitry may comprise a phase error determiner configured to determine a phase error between the first and second signals based on the measured phase relationships and the corresponding target phase relationships. The phase error may be determined at each of the series of sample times, or at particular sample times depending on how often the error need be tracked. This will depend on the particular implementation and application.

According to an embodiment of a second aspect of the present invention, there is provided fractional phase-difference detection circuitry comprising the circuitry according to the aforementioned first aspect.

Circuitry according to the aforementioned first or second aspect may be or comprise integrated circuitry, such as an IC chip.

According to an embodiment of a third aspect of the present invention, there is provided an IC chip comprising the circuitry according to the aforementioned first or second aspect.

According to an embodiment of a fourth aspect of the present invention, there is provided a method of measuring phase in circuitry operable based on a first clock signal having an intended clock frequency F1 and a second clock signal having an intended clock frequency F2, the circuitry comprising a delay line configured to receive the first clock signal, the delay line comprising a plurality of delay units each configured to cause a propagation delay, and the plurality of delay units connected in series along the length of the delay line and defining a series of positions therebetween through which signal edges of the first clock signal propagate over time, the method comprising: sampling the delay line at successive sample times based on the second clock signal and recording at each sample time the position of a given signal edge of the first clock signal along the delay line; and determining a phase angle per delay unit based on successive recorded said positions.

According to an embodiment of a fifth aspect of the present invention, there is provided a computer program which, when executed on a computer of circuitry operable based on a first clock signal having an intended clock frequency F1 and a second clock signal having an intended clock frequency F2, causes the circuitry to carry out a method of measuring phase, wherein the circuitry comprises a delay line configured to receive the first clock signal, the delay line comprising a plurality of delay units each configured to cause a propagation delay, and the plurality of delay units connected in series along the length of the delay line and defining a series of positions therebetween through which signal edges of the first clock signal propagate over time, the method comprising: sampling the delay line at successive sample times based on the second clock signal and recording at each sample time the position of a given signal edge of the first clock signal along the delay line; and determining a phase angle per delay unit based on successive recorded said positions.

According to an embodiment of a sixth aspect of the present invention, there is provided circuitry operable based on a first clock signal having an intended clock frequency F1 and a second clock signal having an intended clock frequency F2, the circuitry comprising: a delay line configured to receive the first clock signal, the delay line comprising a plurality of delay units each configured to cause a propagation delay, the plurality of delay units connected in series along the length of the delay line and defining a series of positions therebetween through which signal edges of the first clock signal propagate over time; an edge detector configured to sample the delay line at successive sample times based on the second clock signal and to record at each sample time the position of a given signal edge of the first clock signal along the delay line, the recorded positions being measured phase relationships between the first and second signals; and a target phase relationship calculator configured to calculate a target phase relationship between the first and second signals at each of a series of said sample times based on those sample times, F1 and F2; and a phase error calculator configured to calculate a phase error between the first and second signals based on the measured phase relationships and the corresponding target phase relationships.

For example, if there is no need to allow for e.g. PVT factors, or if there is a compensated delay line, there may be no need to calculate the period in delay units or the phase angle per delay unit. For example, comparisons between the positions and target phases may be sufficient.

According to an embodiment of a seventh aspect of the present invention, there is provided circuitry operable based on a first clock signal having an intended clock frequency F1 and a second clock signal having an intended clock frequency F2, the circuitry comprising: a delay line configured to receive the first clock signal, the delay line comprising a plurality of delay units each configured to cause a propagation delay, the plurality of delay units connected in series along the length of the delay line and defining a series of positions therebetween through which signal edges of the first clock signal propagate over time; an edge detector configured to sample the delay line at successive sample times based on the second clock signal and to record at each sample time the position of a given signal edge of the first clock signal along the delay line; and a period determiner configured to determine a representative number representative of the period of the first clock signal based on successive recorded said positions, the representative number being the number of said delay units which collectively provide a propagation delay corresponding to that period.

Method and computer program aspects corresponding to the aforementioned sixth and seventh aspects are envisaged. Computer-readable storage medium aspects are also envisaged, the medium have such computer programs stored thereon.

Features of the apparatus (circuitry) aspects apply equally to the method, computer program and storage medium aspects, and vice versa.

Reference will now be made, by way of example, to the accompanying figures, of which:

FIG. 1, as mentioned above, is a schematic diagram of a previously-considered data-processing system;

FIG. 12 is a table of measured phase angles for use in understanding the circuitry of FIG. 11;

FIG. 15 is a block diagram of a computing device which may implement parts of the circuitry described herein.

The following description presents various arrangements which embody the present invention by way of example.

Figure 2:
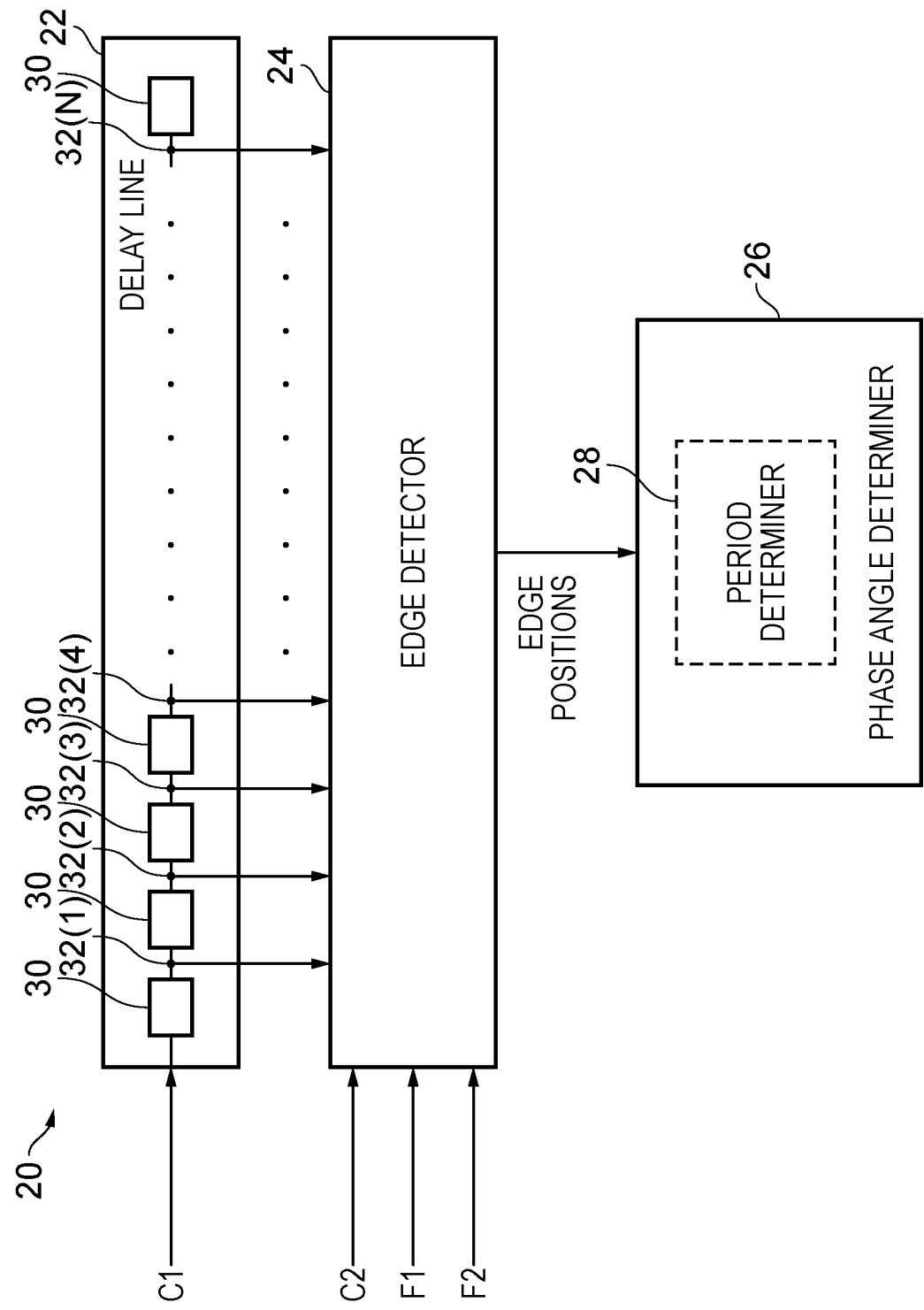
FIG. 2 is a schematic diagram of circuitry operable based on first and second clock signals, embodying the present invention.

FIG. 2 is a schematic diagram of circuitry 20 which is operable based on a first clock signal C1 and a second clock signal C2. It is assumed that the first clock signal C1 has an intended frequency F1 and the second clock signal C2 has an intended frequency F2.

In various arrangements F1 will be different from F2, however it is also possible for F1 and F2 to be the same (in which case the techniques described herein will come into play most clearly in identifying errors in the frequency relationship). Integer and integer-plus-fraction ratios between F1 and F2 are envisaged.

The circuitry 20 comprises a delay line 22, an edge detector 24 and a phase angle determiner 26. The phase angle determiner 26 may, in some arrangements, comprise a period determiner 28.

As indicated in FIG. 2, the delay line 22 is configured to receive the first clock signal C1 at one of its ends. The delay line 22 comprises a plurality of delay units 30 which are each configured to cause a propagation delay, the delay units 30 being connected in series along the length of the delay line 22 and defining a series of positions (i.e., discrete positions or nodes) therebetween through which signal edges of the first clock signal C1 propagate over time. Thus, edges of the first clock signal C1 propagate along the delay line 22 from one end, at which the first clock signal C1 is received, to the other end, via each of the delay units 30. Such ends may be referred to as first and second ends, respectively. In this way, the edges pass through the positions 32(1) to 32(N), one by one in that order, where N is an integer. As an example, N=100 will be used herein for simplicity.

As another example, N may be 256 which is a convenient number for 8-bit digital control. This may be useful where the period of the first clock signal C1 in the delay line 22 is assumed to have a (designed) period length of 100 delay units. With N=256 there would be scope to allow for variation in the period length of the first clock signal C1 as a result of PTV (Pressure, Temperature, Voltage) and frequency variations. It is desirable for at least one period of the first clock signal C1 to fit into the delay line 22. Thus, where N=100 it may be that the period of the first clock signal C1 in the delay line 22 is assumed to have a (designed) period length of less than 100 delay units to allow for PTV and frequency variations.

The rate at which the signal edges propagate along the delay line will be dependent on the propagation delay of the delay units 30, and thus will be dependent on the configuration of the individual delay units 30 as well as on process, temperature and voltage (PTV) factors. To reduce or eliminate the effect of differences in configuration, the delay units are all configured in the same way (e.g. as far as possible, to be identical to one another, in components, their interconnections and their layout). Thus, it is expected that the propagation delay is, as far as possible, uniform (i.e., the same for each delay unit 30). Put another way, the delay line 22 is configured so that the signal edges propagate along its length at a constant rate (in terms of the rate through which the positions 32 or delay units 30 are passed), absent any PVT or similar factors.

The edge detector 24 is configured to sample the delay line 22 at successive sample times based on the second clock signal C2 and to record at each sample time the position of a given (significant) signal edge, e.g., a rising edge, of the first clock signal along the line. That is to say, the edge detector 24 is operable to attribute the given edge at a sample time to one of the positions 32, i.e. one of 32(1) to 32(N), dependent on how far that edge has propagated along the delay line 22 at that time. Herein, position 32(1) may be referred to as position 1, position 32(2) as position 2, as so on and so forth, for simplicity. When the sample times occur is controlled based on the second clock signal C2 and the frequencies F1 and F2, hence they are inputs to the edge detector 24. For example, the sample times may occur every X cycles of the second clock signal C2.

In order to better understand the function of the delay line 22 and edge detector 24, reference will now be made to FIGS. 3 to 6.

Figure 3:
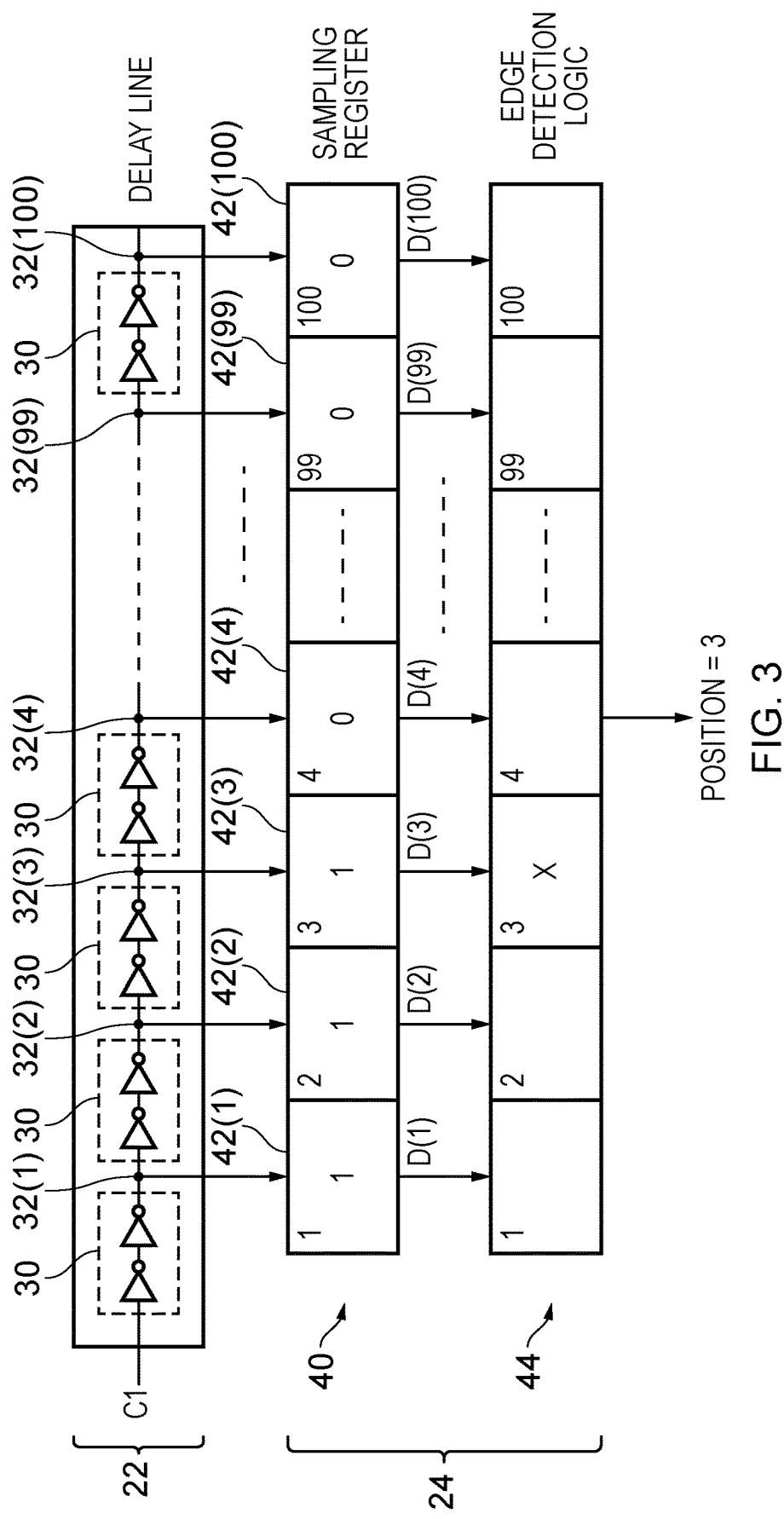
FIG. 3 is a schematic diagram showing parts of the delay line and edge detector of FIG. 2.

FIG. 3 is a schematic diagram showing example parts of the delay line 22 and edge detector 24 of FIG. 2. Where possible herein, like elements are denoted by like reference signs and duplicate description is omitted.

As indicated in FIG. 3, in this arrangement the delay units 30 are configured as pairs of series-connected inverters, such as CMOS inverters. Of course, other types of delay unit are possible, such as simple logical gates like NAND, NOR and XOR. Using pairs of inverters has the advantage that the propagating signal is not inverted from position to position (i.e., the inverters of the pair cancel out each other's inversion). Of course, it would be possible to adopt a single inverter per delay unit 30, to reduce the propagation delay per delay unit 30, however in that case the inversion from one position to the next would need to be taken into account (for example, with every other input to the edge detector 24 being an inverting input).

As also indicated in FIG. 3, the edge detector 24 comprises a sampling register 40 and edge detection logic 44. The sampling register 40 has a cell or storage bit 42 for each of the positions 32(1) to 32(100), where N is taken to be 100 for example as previously mentioned. Thus, cell 42(1) is for sampling position 32(1), i.e. position 1, cell 42(2) is for sampling position 32(2), i.e. position 2, and so on and so forth.

Figure 4:
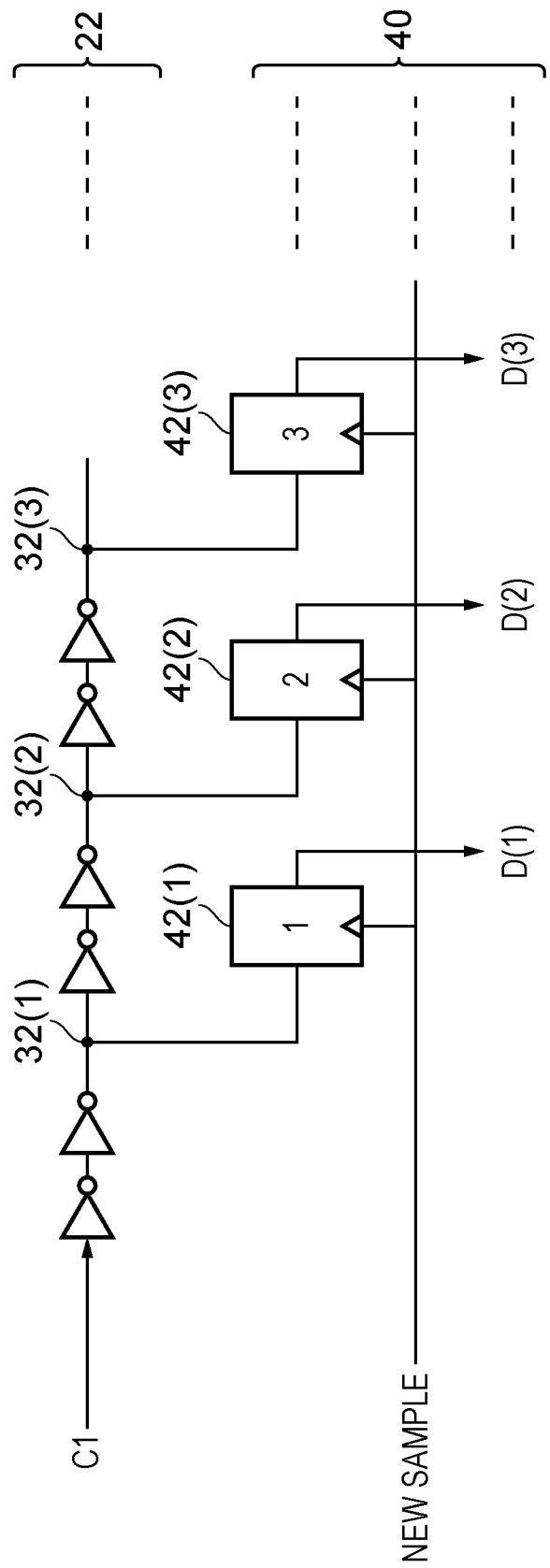
FIG. 4 is a schematic diagram of parts of the delay line and sampling register of FIG. 3.

FIG. 4 is a schematic diagram of example parts of the delay line 22 and sampling register 40 of FIG. 3. As indicated in FIG. 4, in this arrangement the cells 42 are implemented as a latches or flip-flops, triggered by a "new sample" signal so that the digital values ("1" or "0") at the corresponding positions 32 are captured or sampled at each sample time and output as corresponding digital values D(1) to D(100). It will be understood that the clock signals C1 and C2 in this arrangement are digital clock signals (i.e., switched logic-level signals, effectively square waves), hence the digital values.

Figure 5:
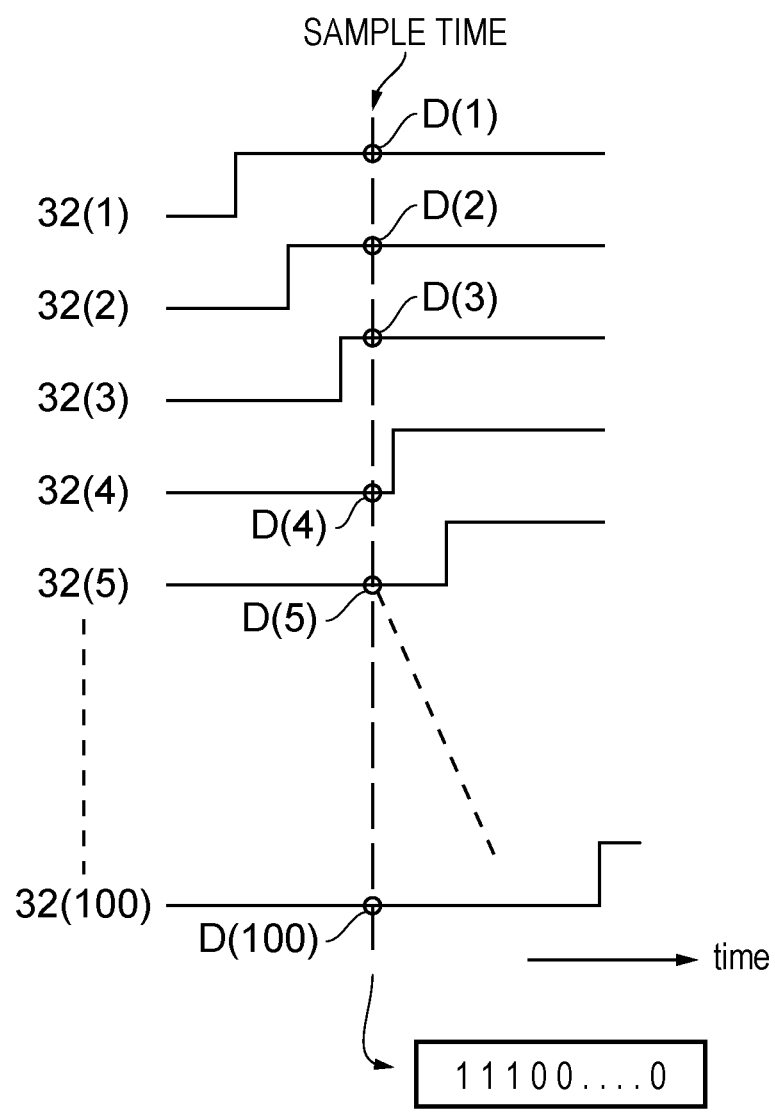
FIG. 5 is a signal diagram indicating signals experienced at certain positions along the delay line.

FIG. 5 is a signal diagram indicating example signals experienced at certain positions 32, assuming an advancing rising edge in the first clock signal C1. As can be seen in FIG. 5, the rising edge is experienced first at position 32(1), i.e. position 1, and then propagates along the delay line 22 so that it is experienced at the subsequent positions 2 to 100, one after the next. The vertical dashed line indicates an example sample time at which point the digital values 11000 . . . 0, i.e. D(1) to D(100), as indicated in FIGS. 3 and 5 are obtained.

The edge detection logic 44 is then configured to search through the digital values stored in the sampling register 40 at a given sample time and locate the rising edge, i.e., where the last 1 is before the 0s start. Naturally, a similar logic could be applied to locate a falling edge if that were taken as the given or significant edge. For simplicity, it will be assumed that the rising edge is the given or significant edge going forwards, but it will be appreciated that the falling edge could be considered instead in other arrangements. In FIG. 3, position 3, i.e. 32(3), has been identified as the location of the rising edge as indicated. Looking back to FIG. 2, the edge detector 24 thus outputs edge positions at the sample times.

Figure 6:
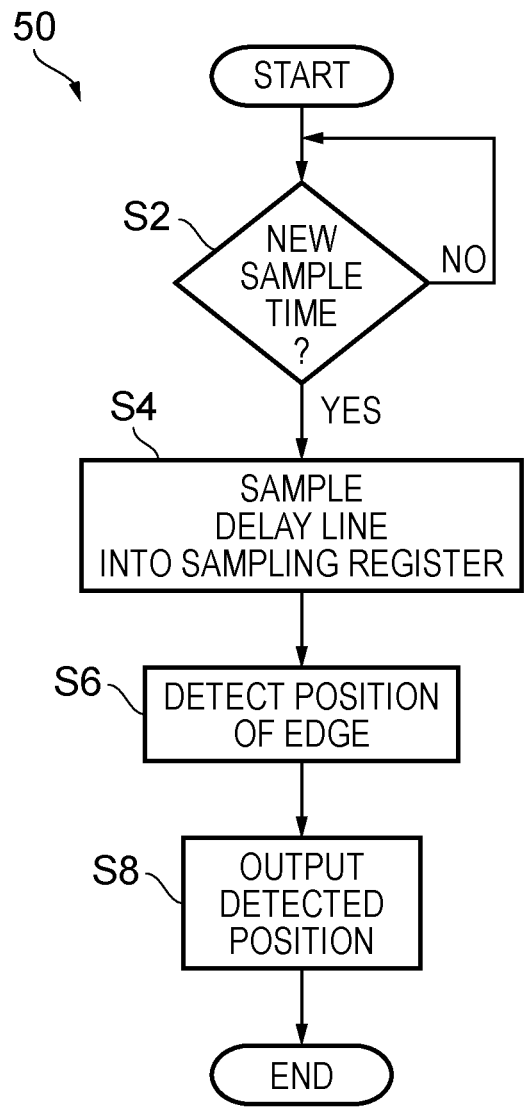
FIG. 6 is a flow diagram of a method useful for understanding the operation of the edge detector of FIG. 2.

FIG. 6 is a flow diagram of a method 50 useful for understanding the operation of the edge detector 24.

At step S2, the method 50 awaits the next sample time, and then proceeds to step S4 where the delay line 22 is sampled and the sampling results are stored in the sampling register 40. The method 50 then proceeds to step S6 where the edge detection logic 44 detects the position of the given (rising) edge and then outputs this position in step S8. Method 50 is effectively repeated during normal operation, so that each sample time is waited for and then acted upon.

Returning to FIG. 2, the phase angle determiner 26 is connected to receive the detected or recorded positions as output from the edge detector at the sample times and is configured to determine a phase angle per delay unit. It will become apparent that this phase angle is the phase angle of the first clock signal C1 which corresponds to the propagation delay of a single delay unit, and thus is a measure of the actual speed of (or the amount of delay caused by) the delay line 22. That is, the smaller this phase angle is, the faster the delay line is and the more delay units 30 that occupy a period P1 of the first clock signal C1. Effectively, the speed of the delay line defines the resolution of measurements taken in the present technique, as will become apparent.

Thus, the present arrangement is configured to assess the speed of the delay line 22, i.e., effectively to measure the effect of, for example, PVT factors. For example, if the supply voltage increases the speed of the delay line may also increase.

It will be appreciated that determination in this context may involve for example calculation, use of a look-up table or both, and the term determine as used herein will be understood accordingly.

The operation of the edge detector 24 and the phase angle determiner 26 will now be explored further, with reference to FIGS. 7 to 10.

It will become apparent that, given the operation of the phase angle determiner 26 in particular, the delay line 22 needs to be long enough (i.e., have enough delay units 32) such that it can hold an entire period P1 of the first clock signal C1 (and allow for PTV and frequency variations). It is assumed herein that the edge detector 24 searches for the first given edge in the delay line 22, i.e., closest to the clock-signal-input end or having the lowest-numbered position, assuming that the positions are numbered in order from the clock-signal-input end with increasing number value (as in FIGS. 2 to 5). With the delay line 22 at least long enough to hold an entire period P1 of the first clock signal C1, it will always be possible to locate a (first) given edge somewhere along its length. However, advantageously, the delay line 22 need not be longer than this for the present purposes (although there may be reasons why a longer delay line 22 is desirable for other reasons). The longer the delay line 22 is, the more hardware and thus chip area is needed, with consequential power consumption implications. Also, as the clock signal C1 propagates along the delay line 22, it becomes more and more degraded.

Figure 7:
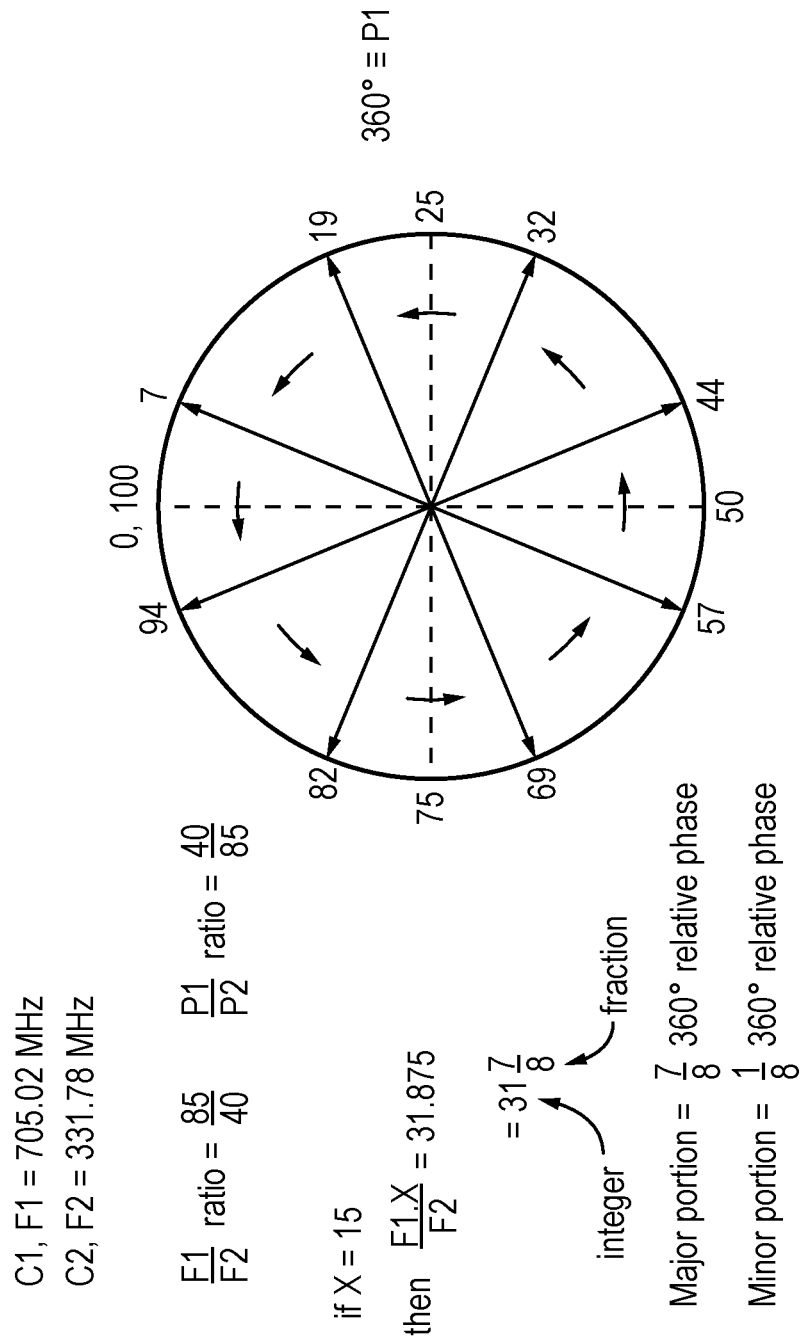
FIG. 7 is a schematic diagram presenting a phase wheel and supporting calculations, useful for understanding the operation of the edge detector and the phase angle determiner of FIG. 2.

FIG. 7 presents a phase wheel and supporting calculations for a running example. In this example, the first clock signal C1 is taken to have a frequency F1=705.02 MHz and the second clock signal is taken to have a frequency F2=331.78 MHz, so that the ratio F1/F2 is 85/40. The corresponding period ratio P1/P2 is then 40/85, where P1 is the period of the first clock signal C1 and P2 is the period of the second clock signal C2.

The ratio 85/40 allows for a simple example to ease explanation, however the present invention is also applicable to more complicated examples, such as where the first and second clock signals C1 and C2 have an integer ratio with a very low common frequency, such as 42381/17925. The present invention allows phase measurements down to a few degrees (depending on the frequency and delay line resolution). For now though, the ratio 85/40 will be followed.

The edge detector 24 is configured to sample the delay line every X cycles of the clock signal C2, where X is preferably an integer and is taken to be an integer in this example.

For improved accuracy (as will be reasoned later), X is chosen or set or selected such that, from one sample time to the next, the phase of the first clock signal C1 rotates (or appears to rotate) slowly around the phase wheel, in either direction. That is to say, such that the phase of the first clock signal rotates (or appears to rotate) in small steps or phase increments around the phase wheel. Small in this context may be such that at least three phase steps or increments occur per revolution. Note that the phase wheel is referenced to the second clock signal C2, so that phases on the phase wheel may be considered relative phases.

In the present example, if X=15 and F1/F2=85/40 as in FIG. 7, then for every 15 cycles of the second clock signal C2 the first clock signal C1 makes (F1.X)/F2=31.875 revolutions, which is 31 and 7/8 revolutions. Thus, X is chosen such that (F1.X)/F2 yields an integer-plus-fraction result. Thus, if the first and second clock signals start in phase with one another, then at the first sample time (after 15 cycles of the second clock signal C2), the phase of the first clock signal C1 will be at 0.875 (7/8) of a revolution. Continuing this analysis, at the subsequent sample times the phase of the first clock signal C1 will be at 0.75 (6/8), then 0.625 (5/8), then 0.5 (4/8), then 0.375 (3/8), then 0.25 (2/8), then 0.125 (1/8), then 0 (0/8), and then back to 0.875 (7/8) of a revolution with the pattern repeating. This can be seen as the phase of the first clock signal C1 appearing to rotate anticlockwise from sample time to sample time.

Note that, considering (F1.X)/F2, there will be no fraction result if F1=F2 and X is an integer. Nevertheless, the present techniques are useful even when F1=F2 since for example errors in the relationship F1:F2 will result in F1≠F2 and thus effectively a fraction result. The present disclosure will be understood accordingly.

It will be apparent that the further the fraction part of the integer-plus-fraction result that is being incremented each time (7/8 in this case) is from 0.5, i.e., the closer it is to 0 or to 1, the slower the phase will appear to rotate (i.e. the larger the number of small steps per phase wheel revolution), and X is thus chosen or set accordingly. It may be that the fraction part is preferably >0.8 or <0.2, for example.

This logic of course translates to the positions 32 in the delay line 22 where the rising edge is recorded (sampled) at the sample times following a repeating pattern, the pattern which repeats comprising the successive recorded positions stepping along the delay line in a given direction in at least three small steps (7 in this case) before returning in the opposite direction via a single large step (corresponding to the phase of the first clock signal C1 crossing the top of the phase wheel).

An example series of recorded positions could be as indicated in FIG. 7, namely 94, 82, 69, 57, 44, 32, 19, 7, 94, 82 . . . . This series is also indicated in FIGS. 8 and 9 to aid in an understanding.

Figure 8:
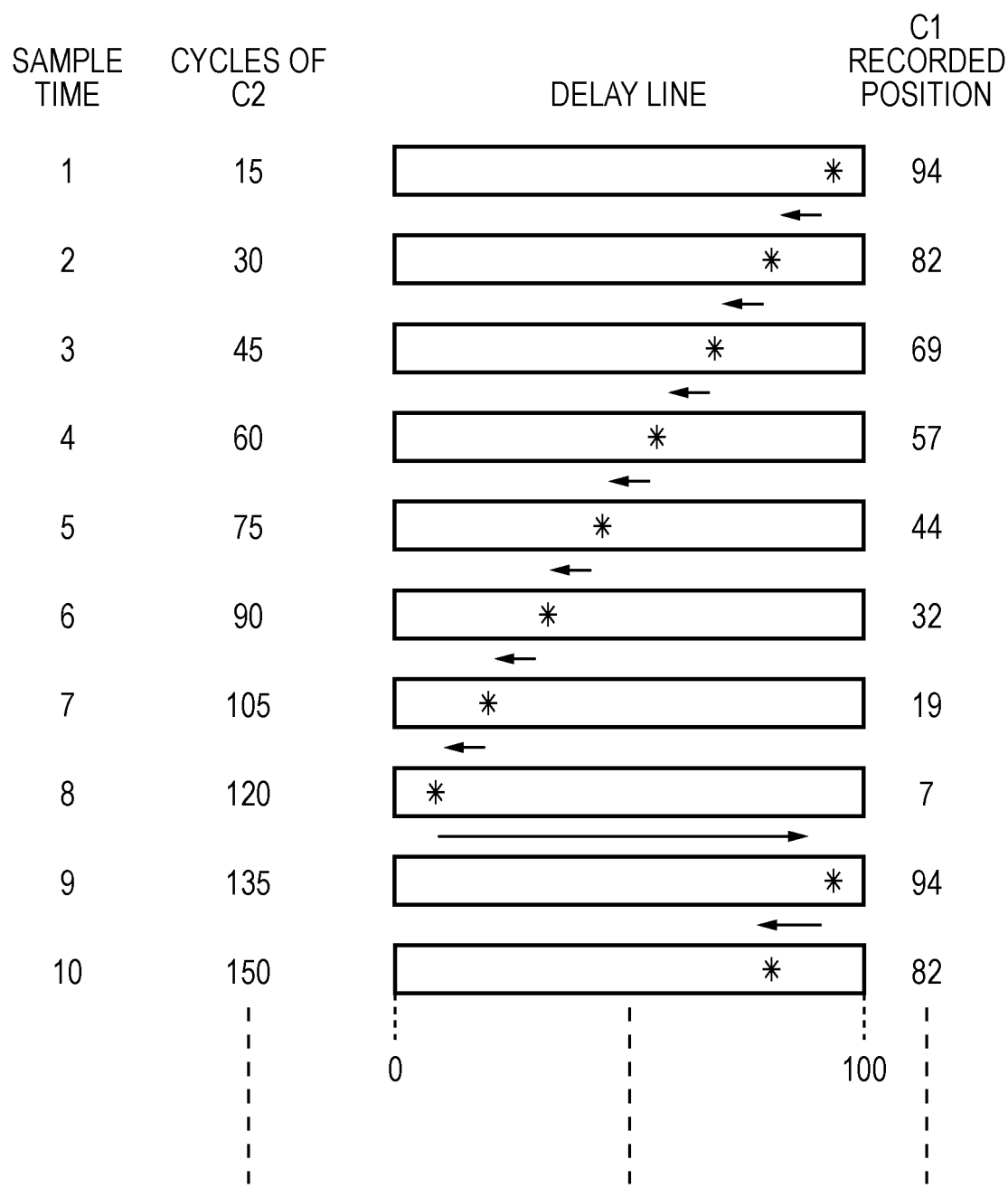
FIG. 8 is a schematic diagram presenting snap shots of the delay line at the sample times considered in FIG. 7.

FIG. 8 effectively shows a snap shot of the delay line 22 at each sample time, with the star each time indicating graphically the position of the rising edge of the first clock signal C1. From one sample time to the next, the number of cycles of the second clock signal C2 increases by X=15 and the position of the rising edge steps along the delay line as indicated by the arrows between the sample times. The repeating pattern in this example is that the recorded positions steps to the left (i.e., to a lower position number) in small steps 7 times before stepping to the right (i.e., to a higher position number) in a single large step. FIG. 9 shows this stepping sequence on a representation of the delay line using arrows to indicate the steps. The direction (+/−) and magnitude of each step (the number of delay units traversed) is also indicated, determined by simply finding the difference in successive recorded positions.

Figure 9:
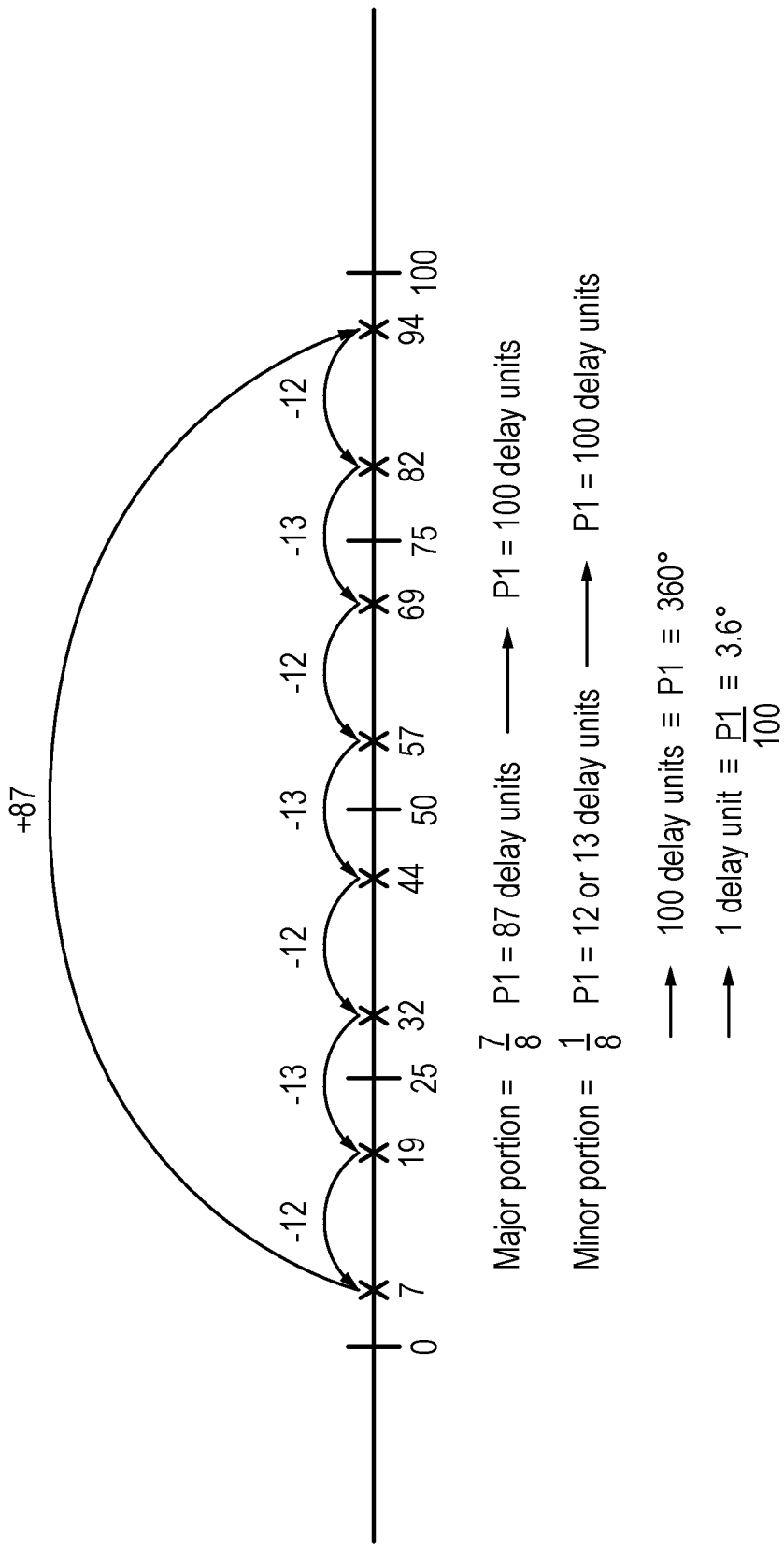
FIG. 9 is a schematic diagram presenting the stepping sequence considered in FIGS. 7 and 8 on a representation of the delay line.

It can be appreciated most readily from FIG. 9 and the relevant fraction 7/8 as discussed earlier, that each small step corresponds to 1/8 of a revolution in phase and that the single large step corresponds in magnitude to 7/8 of a revolution (even though it actually corresponds to 1/8 of a phase revolution spanning the reference point on the phase wheel). The example recorded positions have been plotted on the phase wheel of FIG. 7 and of course correspond to the phase increments discussed earlier.

Looking at FIGS. 7 and 9, if 87 delay units correspond to 7/8 of a revolution of the phase wheel, i.e. to 7/8 of the period P1 of the first clock signals C1, then 100 delay units correspond to a full revolution (360°) of the phase wheel, i.e. to the period P1. Similarly, if 12 or 13 delay units correspond to 1/8 of a revolution of the phase wheel, then again 100 delay units correspond to a full revolution (360°) of the phase wheel. It thus follows that one delay unit corresponds to 3.6° of the phase wheel. In this way, the phase angle determiner 26 would, in this example, determine that the phase angle of the first clock signal C1 which corresponds to the propagation delay of a single delay unit 30 is 3.6°.

Looking again at FIGS. 7 and 9, it can be seen that with the example increment fraction (0.875 or 7/8) being close to 1 the phase of the first clock signal C1 appears to rotate anticlockwise from sample time to sample time. If X were instead chosen to be 17, the increment fraction would be 0.125 or 1/8, i.e., close to 0, and the phase of C1 would instead appear to rotate clockwise from sample time to sample time. This would give the same pattern as in FIG. 9 except with the direction of the steps changed. X=15, 23 . . . would give an increment fraction 0.875 whereas X=17, 25 . . . would give an increment fraction 0.125 in this example.

At this juncture, it is worth noting that for improved accuracy it is beneficial to use the number of delay units which are traversed by the large step (87 in FIG. 9) to calculate the period of the first clock signal C1 in terms of delay units (100 delay units in FIG. 9) rather than one of the small steps (12 or 13 in FIG. 9). This is because an error of e.g., one or two delay units on the small steps (e.g., 12 or 13+/−1) would have a bigger percentage effect than on the large step (e.g., 87+/−1). By choosing X so that the increment fraction is relatively far from 0.5, i.e. close to 0 or to 1 as discussed above, there will be a clear relatively large step which can be used for improved accuracy. For example, the relatively large step will correspond to (much) more than half (0.5) of the period P1.

Note that if the increment fraction is close to 0 (constituting a minor portion of a phase revolution), its complement (constituting the complementary major portion of a phase revolution) corresponds to the large step. Looking at FIG. 9, if the increment fraction is 0.125 (1/8) then its complement is 0.875 (i.e., 1-0.125) which corresponds to 87 delay units in this example.

Figure 10:
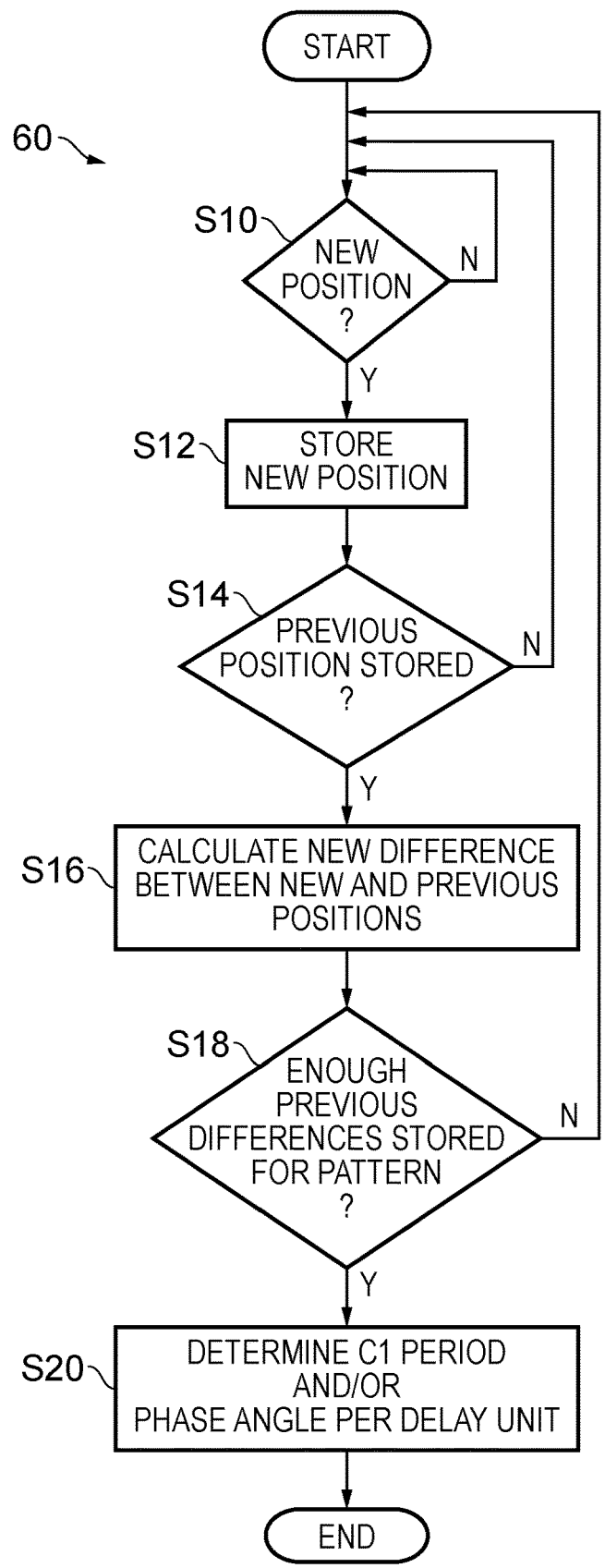
FIG. 10 is a flow diagram useful for understanding the operation of the edge detector and the phase angle determiner of FIG. 2.

FIG. 10 is a flow diagram of a method useful for understanding the operation of the edge detector 24 and the phase angle determiner 26.

At step S10, it is determined whether the edge detector 24 has issued a new position, i.e., whether there has been a new sample time. If not, a new position is awaited. If a new position has been issued by the edge detector 24, the method proceeds to step S12 where the new position is stored and then on to step S14 where it is determined whether there is already a previous position stored.

If there is no previous position stored, the method returns to step S10. If a previous position has been stored, the method proceeds from step S14 to step S16 where a new difference between the new and (immediately) previous position is calculated or determined.

The method then proceeds to step S18 where it is determined whether there are enough previous differences stored such that a pattern as described above (see e.g. FIG. 9) is present. If no such pattern is present, the method proceeds back to step S10. If, however, such a pattern is present, the period of the first clock signal C1 in terms of delay units is determined and/or the phase angle per delay unit is determined.

Returning again to FIG. 2 and the phase angle determiner 26, with the functionality discussed in connection with FIGS. 7 to 10 in mind, it will be appreciated that each measurement of the period of the first clock signal C1 in terms of delay units, or the phase angle of the first clock signal C1 which corresponds to the propagation delay of a single delay unit, will in practice suffer a degree of error. Thus, in some arrangements these measurement results may be averaged over time, i.e. using a running or moving average of a most recent set of measurement results. This would for example allow the circuitry to track e.g. changes in temperature or operating voltage which would affect the speed of the delay line 22, whilst smoothing out spurious results (cf. low-pass filter).

An example use case for the measurement results will now be considered in connection with FIGS. 11 to 14.

Figure 11:
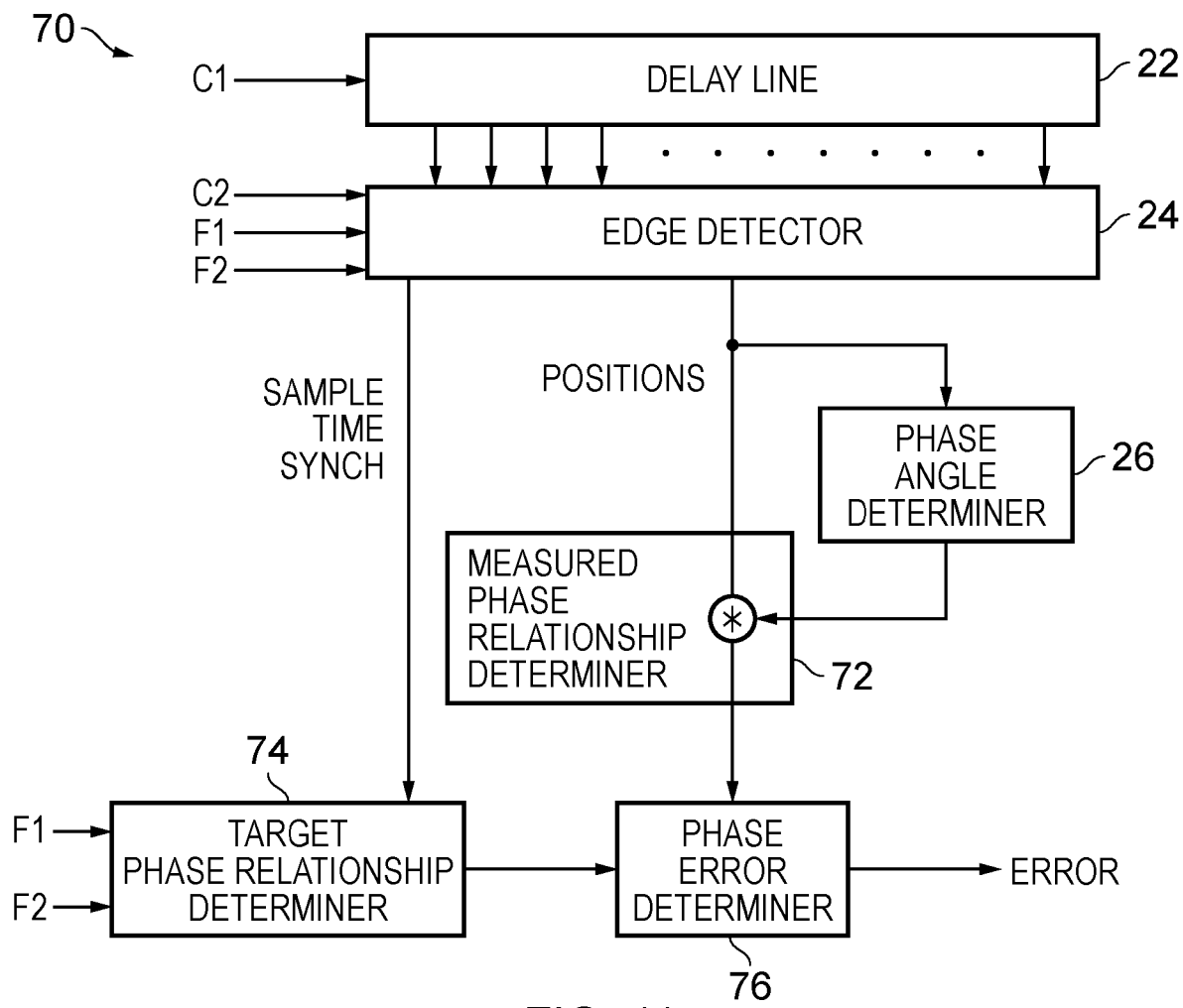
FIG. 11 is a schematic diagram of fractional phase detection circuitry based on the circuitry of FIGS. 2 to 4.

FIG. 11 is a schematic diagram of circuitry 70 which, like the other circuitry described herein, is operable based on the first clock signal C1 and the second clock signal C2.

As before, it is assumed that the first clock signal C1 has the intended frequency F1 and the second clock signal C2 has the intended frequency F2.

The circuitry 70 comprises the delay line 22, the edge detector 24 and the phase angle determiner 26, as described in connection with circuitry 20 of FIG. 2 and duplicate description will be omitted. Circuitry 70 also comprises a measured phase relationship determiner 72, a target phase relationship determiner 74 and a phase error determiner 76.

The measured phase relationship determiner 72 is operable to effectively multiply the phase angle per delay unit (3.6° in the above example) by the positions as output by the edge detector 24 to yield the measured phase angles of the first clock signal C1 corresponding to the sample times. Taking the example series of positions 94, 82, 69, 57, 44, 32, 19, 7, 94, 82 of FIG. 7 and the corresponding example phase angle per delay unit 3.6°, this would yield measured phase angles as in the table of FIG. 12. These measured phase angles are then output to the phase error determiner 76.

The target phase relationship determiner 74 is operable, based on information of the frequencies F1 and F2 and a synchronising signal indicating when each sample time occurs (as issued in this arrangement by the edge detector 24), to calculate target phase angles of the first clock signal C1 corresponding to the measured phase angles as in the table of FIG. 12. This could be done by effectively adding the theoretical (i.e. calculated based on assumed perfect clock signals) phase increment each time a sample is taken to the previous target phase angle, in the FIG. 7 example this being 7/8 of 360°, i.e. 315°, and taking a modulo 360° result (to give the target phase angle on the phase wheel), for example yielding 315°, 270° (630° module 360°), 225° (945° modulo 360°), etc. Of course, it may be desirable to use the non-modulo results (315°, 630°, 945° etc.) to track numbers of cycles in cases of significant frequency drift. The target phase angles are then also output to the phase error determiner 76.

The phase error determiner 76 is operable to compare corresponding target and measured phase angles, and output corresponding error values. Such comparison could involve finding the difference between the corresponding target and measured phase angles, which may be a more useful output than simply larger/smaller (ahead/behind) indications.

Figure 13:
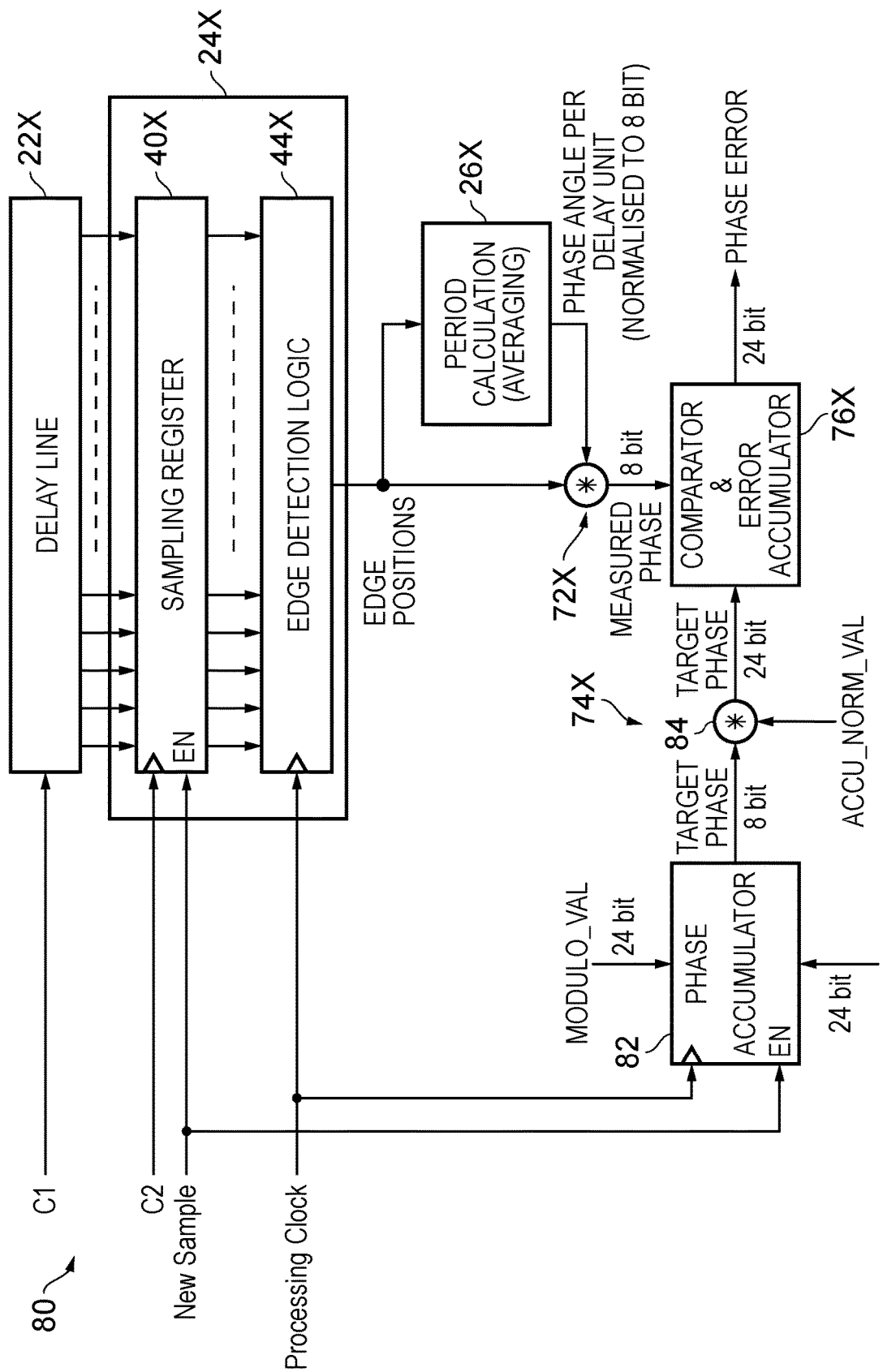
FIG. 13 is a schematic diagram of fractional phase detection circuitry based on the circuitry of FIG. 11.

FIG. 13 is a schematic diagram of circuitry 80 which, like the other circuitry described herein is operable based on the first clock signal C1 and the second clock signal C2. As before, it is assumed that the first clock signal C1 has the intended frequency F1 and the second clock signal C2 has the intended frequency F2.

The circuitry 80 comprises elements which correspond to those in FIGS. 2 and 3, however circuitry 80 represents a detailed implementation. As such, those elements in circuitry 80 which correspond closely with elements in FIGS. 2 and 3 are denoted in the same way, but with the suffix X. So, for example, the edge detector 24X corresponds to the edge detector 24, but with some differences relating to the detailed implementation of FIG. 13.

In the circuitry 80, the sampling register 40X receives a "new sample" signal, so that the edge detector 24X need not determine itself when the next sample time occurs. The edge detection logic 44X receives a processing clock, based on which it carries out its operations. The processing clock may be independent of the first and second clock signals C1 and C2.

As indicated in FIG. 13, the phase angle per delay unit output by the phase angle determiner 26X (labelled as a Period Calculation (Averaging) unit) is output as an 8-bit digital number (i.e. normalized to 8-bit, i.e. to 0 to 255). The edge positions output by the edge detector 24X are also digital numbers so that the measured phase angles input to the phase error determiner 76X (labelled as a Comparator & Error Accumulator) are 8-bit digital numbers.

The phase accumulator 82 and normalizing unit 84 together constitute the target phase relationship determiner 74X and correspond to the target phase relationship determiner 74 of FIG. 11.

The phase accumulator 82 is configured to receive the processing clock, based on which it carried out is operations. The phase accumulator 82 also receives the "new sample" signal so that it knows when to create the next target phase angle. The phase accumulator 82 also has MODULO_VAL and PHASE_INCREMENT inputs.

The PHASE_INCREMENT is a value which can be incremented each sample time to create a value for the next target phase angle. In this arrangement, this is expressed as a 24-bit value. Taking the 85/40 ratio from the example in FIG. 7, this could be the value 35 (i.e. 7/8 of 40), in this case expressed as the upper 6 bits of the 24-bit value (since 35 can be expressed as a 6-bit number). For example, $0.875*40*2^{18}$ (for normalizing to 24-bit).

The MODULO_VAL is the modulo value corresponding to a full phase revolution (i.e. 360°), so that effectively a modulo 360° value can be output to represent the target phase angle on the phase wheel. In this arrangement, this is also expressed as a 24-bit value. Taking the 85/40 ratio from the example in FIG. 7, this could be the value 40, in this case expressed as the upper 6 bits of the 24-bit value (since 40 can also be expressed as a 6-bit number).

The use of the upper bits of the 24-bit values as discussed above of course allows ratios with very large antecedent and consequent terms, i.e. with F1 and F2 in the ratio F1/F2 being very large numbers. Put another way, the target phase angles can be expressed to a high degree of accuracy.

Thus, each time a new target phase angle is needed (i.e. each sample time), the phase accumulator 82 outputs a 24-bit value indicating that target phase angle. The normalizing unit 84 then normalizes these values to 8-bit values for input to the phase error determiner 76X for comparison with the corresponding 8-bit measured phase angles. This may involve simply taking the upper 8 bits of the 24-bit target phase angle values.

The phase error determiner 76X is then operable to compare corresponding target and measured phase angles (or phase positions), and output corresponding error values.

Such comparison could involve finding the difference between the corresponding target and measured phase angles. The error values are expressed as 8-bit phase error values and 16-bit cycle error values, so that not only phase errors in a single revolution of phase of the first clock signal C1 can be measured but also frequency drift which crosses several revolutions. For example, errors could be accumulated to track errors which build up over time to amount to integer-plus-fraction cycles of the phase wheel. In this example, the 8-bit phase error may correspond to the fraction part and the 16-bit cycle error may correspond to the integer part. Clearly, using a 16-bit value for the integer part allows for significant drift between C1 and C2, however in practice it may be convenient to operate using 16-bit values in which case the scope for measuring significant drift follows. If a control loop used to compensate for or reduce the error between the two frequencies (e.g. in a PLL) has a very low bandwidth (long reaction time—which may be useful to avoid e.g. "shocking" the second data processing module 6 in FIG. 1—see the loop filter 18) it might happen that the phase error accumulates to several cycles.

It will be appreciated that the use of 8-bit and 24-bit values in the circuitry 80 is simply one example implementation and that other implementations would be possible.

Figure 1:
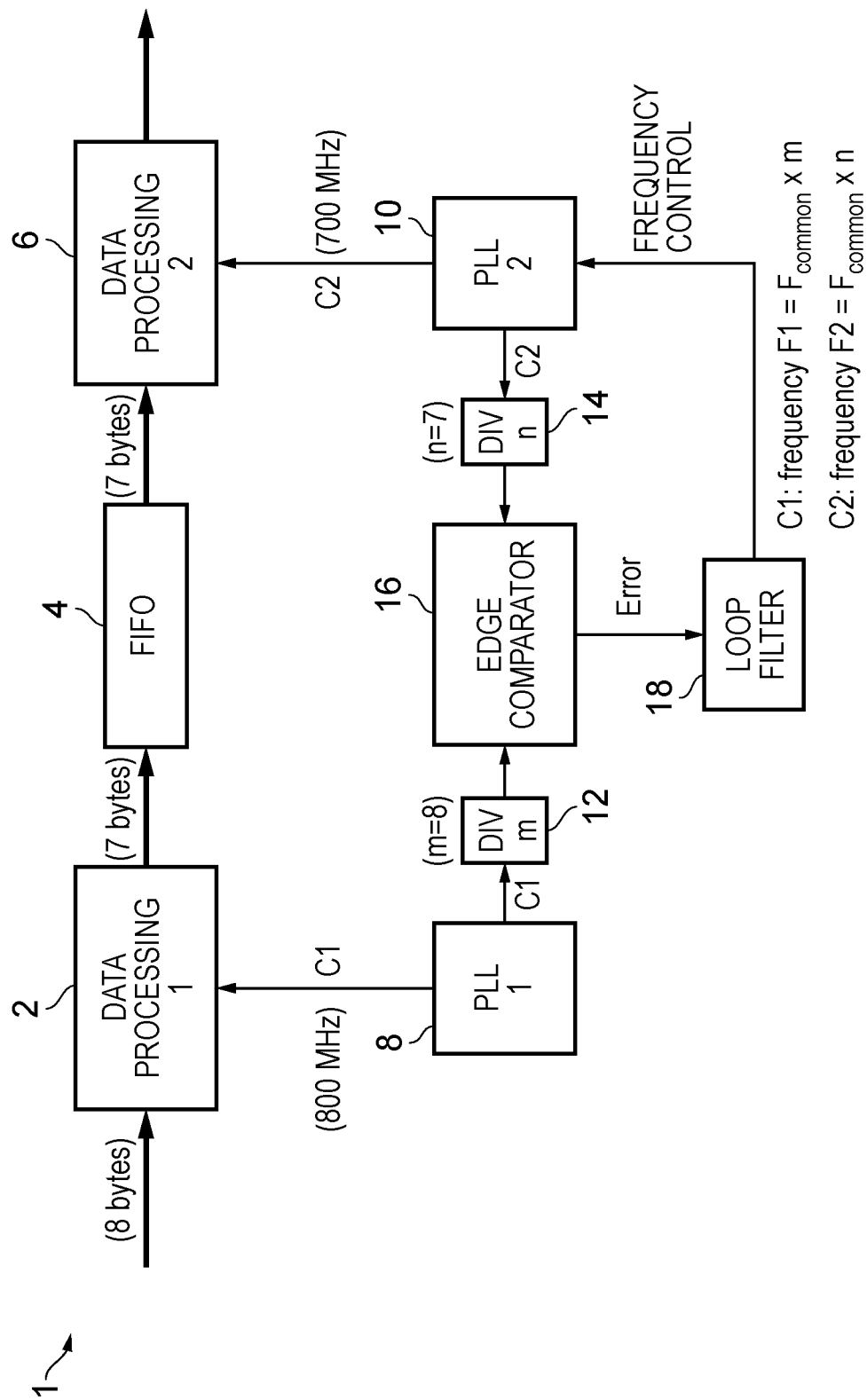

It will be appreciated from the discussion of FIGS. 11 to 13 that the circuitry 70 and 80 may be considered a phase detector, and in particular a fractional phase detector, useful for example in place of the edge comparator 16 and dividers 12 and 14 of the circuitry 1 of FIG. 1. Such circuitry may be considered fractional phase detector circuitry.

Figure 14:
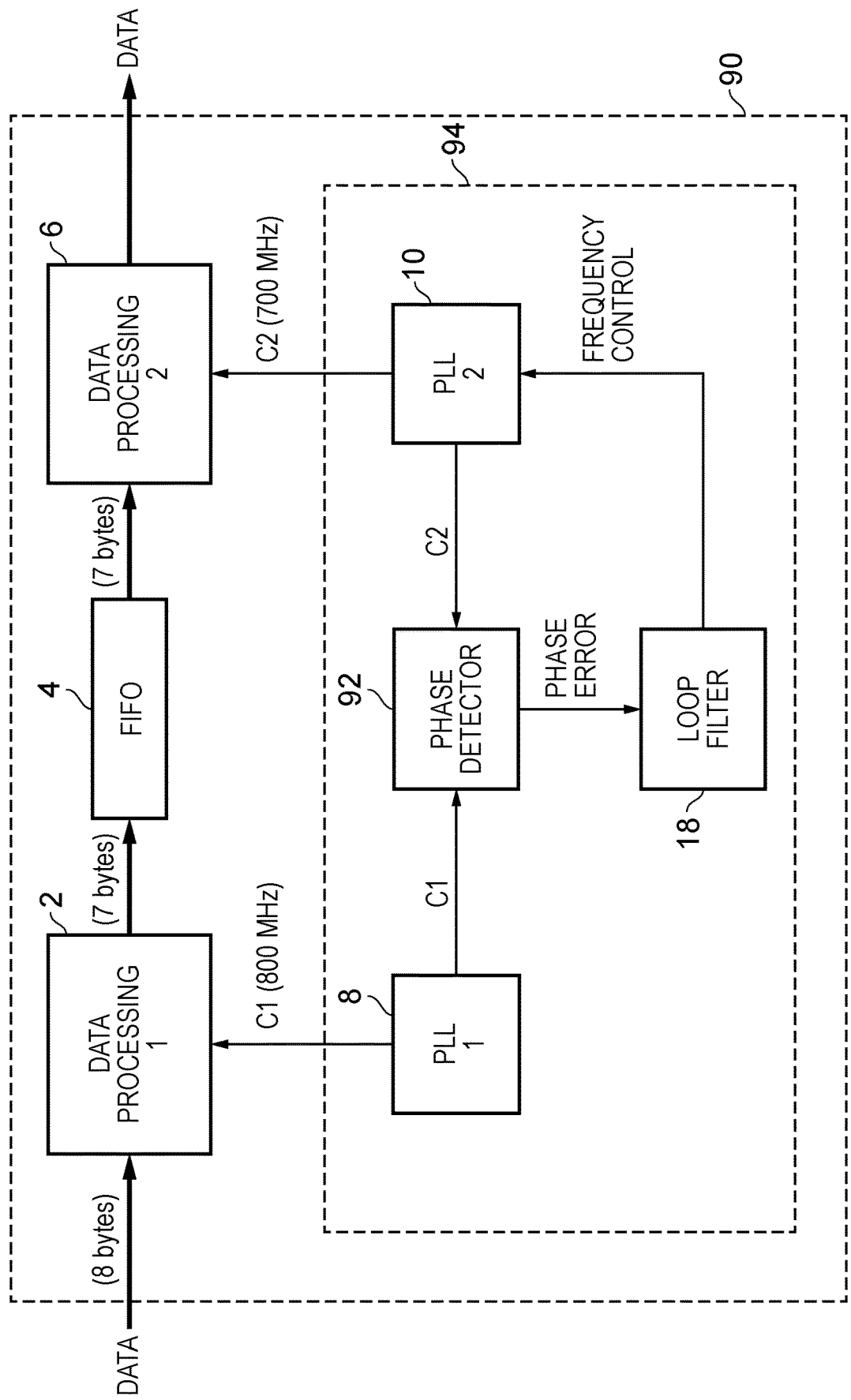
FIG. 14 is a schematic diagram of a data-processing system based on that of FIG. 1 but employing circuitry based on that in FIG. 11 or 13.

With this in mind, FIG. 14 is a schematic diagram of a data-processing system 90. Data-processing system 90 corresponds closely to data-processing system 1 of FIG. 1, and like elements are denoted with like reference signs so that duplicate description may be omitted.

The main difference between data-processing system 90 and data-processing system 1 is that in data-processing system 90 the edge comparator 16 and dividers 12 and 14 have been replaced with a phase detector 92. The phase detector 92 corresponds to the circuitry 70 or 80, and thus benefits from the significant advantages of such circuitry. Thus, better control may be had over the clock signals C1 and C2, so that the FIFO buffer 4 in data-processing system 90 need not be as large as that in data-processing system 1.

It is noted that the circuitry 94, forming part of the data-processing system 90, is somewhat akin to a PLL and embodies the present invention, as does the phase detector 92 itself.

It will be appreciated that the circuitry disclosed herein offers a relatively small and efficient digital architecture, to measure phase error between the clock signals C1 and C2 with high precision at a programmable rate (i.e. by setting the value X, which may be referred to as the phase measurement distance). Therefore, the overall control loop behaviour and performance—e.g. of the FIG. 14 circuitry—is independent from the clock ratio F1/F2. That is, the circuitry will allow, for any divider ratio, a very similar optimized performance. Digital filter architectures can be used to employ the error information (the phase error signals in FIGS. 11 and 13) to reach improved (optimised) loop performance, for example of the loop filter 18 in FIG. 14.

With the circuitry disclosed herein, it is possible to measure the phase relation between the clock signals C1 and C2 at a high sampling rate, where the two clocks may have an integer ratio F1/F2 with a very low common frequency (for example, 42381/17925). This is achieved in a digital way, as will already be apparent. It is possible to measure the phase error down to a few degrees (depending on the frequency and delay line resolution). As an example, implementations of the circuitry disclosed herein (see e.g. FIG. 13, or the explanation in connection with FIGS. 7 to 9) may achieve a measurement resolution well below 6° at 750 MHz.

This can improve the control loop—e.g. of the FIG. 14 circuitry—significantly and allows better (and more flexible) frequency control loop parameters. Also, with reference to FIG. 14, the total phase error between the two frequencies F1 and F2 can be minimized and FIFO structures such as FIFO buffer 4 for the data paths between the two clock domains 2 and 6 can be reduced to a minimum. This can also help to reduce system latencies to a minimum.

The circuitry disclosed herein is considered advantageous in that it may be implemented entirely in digital in conjunction with the delay line 22. In addition, the system requires no calibration despite the fact that the delay line has process, temperature and voltage variation (PTV). This variation will have, due to the architecture of the circuitry disclosed, no influence on the achieved result. This is because the same delay line 22 or portion thereof is used to assess its speed (i.e. measure the phase angle per delay unit) as well as obtain the measured phase angles. Effectively, a common mode error between the two measurements is eliminated. In such a case, only the resolution may vary within a predictable limits.

As a summary, to carry out the phase measurement with the delay line 22 it is useful to find the period P1 of the clock signal C1 in a number of delay units—knowing the period P1 is advantageous if e.g. a look-up table is employed to determine the phase angle per delay unit. However, as already explained, the intermediate step of finding the period P1 in delay units may be omitted—from the pattern of recorded positions, the phase angle per delay unit may be determined (e.g. calculated) directly. The present invention allows calculation or determination of the period P1 (or directly, the phase angle per delay unit) by analysing the edge of the sampled clock signal C1. The delay line 22 in this technique has at a minimum the propagation delay of one period P1 (and need not be longer). In practice, a length of delay line may be chosen to accommodate an expected range of P1 values and PTV variations.

The period or phase angle per delay unit measurement is done with the same delay units as the phase measurement in FIGS. 11 and 13 and therefore the mismatch between period (phase angle per delay unit) and phase measurements is reduced to a minimum. Although it would be possible to use a delay line 22 long enough to hold two periods P1 of the clock signal C1, so that the period P1 can be measured by detecting a pair of consecutive rising edges for example, a longer delay line adds complexity and there would also be greater signal degradation along the length. Further, the period or phase angle per delay unit measurement would then be done with some delay units which are not needed for the phase measurement, opening up mismatch errors between the period (phase angle per delay unit) and phase measurements.

The fractional phase detector (FPD) circuitry of e.g. FIG. 13 may be viewed as comprising four major functional blocks. These are: (1) the delay line 22 with sampling register 40X; (2) the period calculation and averaging by element 26X; (3) the comparator and error accumulator functionality of element 76X; and (4) the phase accumulator 82 (for calculation of expected or target phase). The delay line 22 with sampling register 40X and edge detection logic 44X search for the first rising edge of the sampled clock C1 in the delay line. This information is then used by the period calculation logic in element 26X to measure the clock period P1 (or directly, the phase angle per delay unit). The phase accumulator 82 calculates the expected phase of the sampled clock C1. This information is then used by the comparator and error accumulation logic in element 76X to determine the actual phase difference between the two clocks C1 and C2 (i.e. the error information indicates how clock C1 is tracking relative to clock C2). Particular logic (that takes current error direction and accumulated error into account, allows to measure also multi-cycle error and to sum up the correct total error) allows measurement of multi-cycle phase error. Note that the error between two measurement points (i.e. sample times) should not exceed an upper limit, such as the theoretical limit of 180°. At that point it is difficult to determine the error direction. To have some margin in the calculation it may be preferable not to exceed 135°. This limitation helps enable the obtaining of distinct information on the phase drift (+− phase error).

Core functionality has been explained in connection with FIGS. 7 to 9, for determining one or both of the period of the clock signal C1 in delay units and the phase angle per delay unit. To achieve good performance, the value of X (the sampling distance) may be selected such that there is a "slow" rotation speed of the phase accumulator. Either direction of rotation is possible. For good accuracy, the slow rotation allows there to be a clear relatively-large step, which can be used in the determination. For example, knowing the size of the larger of the increment fraction and its complement (7/8 in the FIG. 7 example) allows the total number of delay units per period P1 and/or the phase angle per delay unit to be calculated. A look-up-table may be used to go from the total number of delay units per period P1 to the phase angle per delay unit. With this information it is then possible to calculate from the recorded edge positions the relative phase angles of the clock signal C1.

Incidentally, the carry on the delay line 22 (the large step in the opposite direction to that of the small steps) may occur in a different cycle to the equivalent carry in the phase accumulator. This is not critical, as the period measurement and phase angle per delay unit measurement use only the recorded positions from the delay line 22 to determine the carry occurrence on the delay line 22.

For better accuracy, period measurements and phase angle per delay unit measurements may be filtered, e.g. with a moving average. The PTV changes will not affect the functionality of the phase comparator. If the speed (propagation delay) of the delay line 22 changes, this will be reflected automatically in the period measurements and phase angle per delay unit measurements and the phase measurement (cf. common mode). As these measurements are measured with the same delay line 22, there will be substantially no mismatch between them. Limitations of the circuitry (system) are reduced to the maximum measurable error between two sample times. Below the already-mentioned 135° it is readily possible to determine distinctly the error direction. If the error gets too close to 180° it may be more difficult for the logic to analyse direction correctly (for example, some uncertainty of the measurements taken from the delay line 22 exists and may be taken into account). Thus, the overall precision will heavily depend on the delay line 22 implementation, and as such it is important to have a well-balanced delay line 22 where each delay unit 30 has only a relatively small (as small as possible) mismatch in delay with the other delay units 30 to avoid non-linearity in the measurements.

To cover a wide frequency range, it is envisaged several delay lines 22 with different delays could be adopted, with the relevant delay line 22 being utilised dependent on the frequencies in use. The circuitry disclosed herein will be understood accordingly.

It is considered advantageous in embodiments of the present invention to allow precise phase measurement of two different clocks with m/n ratio without using the common frequency, to carry out period and phase measurements using the same delay units to reduce mismatch and complexity, to not need to carry out separate PTV compensation in respect of the delay line 22 (no calibration or compensation logic to correct any PTV variations), and to be able to realize the functionality substantially in digital circuitry.

Looking back to FIG. 2 for example, it will be appreciated that parts of the circuitry disclosed herein may be implemented in hardware, or as software modules running on one or more processors, or on a combination thereof. That is, those skilled in the art will appreciate that a microprocessor or digital signal processor (DSP) may be used in practice to implement some or all of the functionality described above. For example, the functionality of the edge detector 24 and phase angle determiner 26 may be implemented in hardware (e.g. digital circuitry as apparent from FIGS. 3 and 4), or as software modules running on a processor (by feeding the inputs from the positions 32 to input terminals of the processor).

The invention may thus also be embodied as one or more device or apparatus programs (e.g. computer programs and computer program products) for carrying out part or all of the methods described herein. Such programs embodying the present invention may be stored on computer-readable media, or could, for example, be in the form of one or more signals. Such signals may be data signals downloadable from an Internet website, or provided on a carrier signal, or in any other form.

FIG. 15 is a block diagram of a computing device 100, which embodies the present invention, and which may b used to implement some or all of the steps of a method embodying the present invention, and perform some or all of the tasks of apparatus of an embodiment. For example, the computing device 100 of FIG. 15 may be used to implement all, or only some, of methods 50 and 60. As another example, the computing device of FIG. 15 could perform some or all of the functionality of the elements other than delay line 22 in FIGS. 2 to 4, 11 and 13.

The computing device comprises a processor 93 and memory 94. Optionally, the computing device also includes a network interface 97 for communication with other such computing devices, for example with other computing devices.

For example, an embodiment may be composed of a network of such computing devices. Optionally, the computing device also includes one or more input mechanisms such as keyboard and mouse 96, and a display unit such as one or more monitors 95. The components are connectable to one another via a bus 92.

The memory 94, may include a computer readable medium, which term may refer to a single medium or multiple media (e.g., a centralized or distributed database and/or associated caches and servers) configured to carry computer-executable instructions or have data structures stored thereon. Computer-executable instructions may include, for example, instructions and data accessible by and causing a general purpose computer, special purpose computer, or special purpose processing device (e.g., one or more processors) to perform one or more functions or operations. Thus, the term "computer-readable storage medium" may also include any medium that is capable of storing, encoding or carrying a set of instructions for execution by the machine and that cause the machine to perform any one or more of the methods of the present disclosure. The term "computer-readable storage medium" may accordingly be taken to include, but not be limited to, solid-state memories, optical media and magnetic media. By way of example, and not limitation, such computer-readable media may include non-transitory computer-readable storage media, including Random Access Memory (RAM), Read-Only Memory (ROM), Electrically Erasable Programmable Read-Only Memory (EEPROM), Compact Disc Read-Only Memory (CD-ROM) or other optical disk storage, magnetic disk storage or other magnetic storage devices, flash memory devices (e.g., solid state memory devices).

The processor 93 is configured to control the computing device 100 and execute processing operations, for example executing computer program code stored in the memory 94 to implement the methods of functionality mentioned above or defined in the claims. The memory 94 stores data being read and written by the processor 93. As referred to herein, a processor may include one or more general-purpose processing devices such as a microprocessor, central processing unit, or the like. The processor may include a complex instruction set computing (CISC) microprocessor, reduced instruction set computing (RISC) microprocessor, very long instruction word (VLIW) microprocessor, or a processor implementing other instruction sets or processors implementing a combination of instruction sets. The processor may also include one or more special-purpose processing devices such as an application specific integrated circuit (ASIC), a field programmable gate array (FPGA), a digital signal processor (DSP), network processor, or the like. In one or more embodiments, a processor is configured to execute instructions for performing the operations and steps discussed herein.

The display unit 95 may display a representation of data stored by the computing device and may also display a cursor and dialog boxes and screens enabling interaction between a user and the programs and data stored on the computing device. The input mechanisms 96 may enable a user to input data and instructions to the computing device.

The network interface (network I/F) 97 may be connected to a network, such as the Internet, and is connectable to other such computing devices via the network. The network I/F 97 may control data input/output from/to other apparatus via the network. Other peripheral devices such as microphone, speakers, printer, power supply unit, fan, case, scanner, trackerball etc. may be included in the computing device.

Methods embodying the present invention may be carried out on a computing device such as that illustrated in FIG. 15. Such a computing device need not have every component illustrated in FIG. 15 and may be composed of a subset of those components.

The above-described embodiments of the present invention may advantageously be used independently of any other of the embodiments or in any feasible combination with one or more others of the embodiments.

The invention claimed is:

1. Phase measurement circuitry operable based on a first clock signal having an intended clock frequency F1 and a second clock signal having an intended clock frequency F2, the circuitry comprising:
   a delay line configured to receive the first clock signal, the delay line comprising a plurality of delay units each configured to cause a propagation delay, and the plurality of delay units connected in series along a length of the delay line and defining a series of positions therebetween through which signal edges of the first clock signal propagate over time;
   an edge detector configured to sample the delay line at successive sample times based on the second clock signal and to record at each sample time the position of a given signal edge of the first clock signal along the delay line; and
   a phase angle determiner configured to determine a phase angle per delay unit based on successive recorded said positions,
   wherein the edge detector is configured to sample the delay line every X cycles of the second clock signal, and wherein X is set so that:
   (X*F1)/F2 gives an integer plus fraction result, the fraction of the result indicating a corresponding fraction of a full phase revolution of the first clock signal by which the phase of the first clock signal is expected to advance every X cycles of the second clock signal, the fraction of the full phase revolution of the first clock signal and its complement constituting complementary major and minor portions of the full phase revolution of the first clock signal; and
   the fraction of the result is sufficiently larger than 0.5 or sufficiently smaller than 0.5 such that the successive recorded positions follow a repeating pattern, the pattern which repeats comprising the successive recorded positions stepping along the delay line in a given direction in at least 3 relatively-small steps and then returning in an opposite direction via a single relatively-large step, each step traversing consecutive said delay units.

2. The circuitry according to claim 1, wherein:
   the given signal edge is a rising edge, and optionally is a first rising edge which appears along the length of the delay line from an end of the delay line where the first clock signal is received; or
   the given signal edge is a falling edge, and optionally is a first falling edge which appears along the length of the delay line from the end of the delay line where the first clock signal is received.

3. The circuitry according to claim 1, wherein the delay line is configured so that its propagation delay is at least as long as an intended period P1 of the first clock signal or an upper end of a given range of values of the period P1, and optionally shorter than 2 times the intended period P1 or the upper end of the given range of values of the period P1.

4. The circuitry according to claim 1, wherein:
   for the or each relatively-large step, the propagation delay caused by a number of delay units traversed by that step corresponds to the major portion of the full phase revolution of the first clock signal; and the phase angle determiner is configured to determine, for the or each relatively-large step, said phase angle per delay unit based on the phase angle corresponding to that major portion and the number of said delay units traversed by that step.

5. The circuitry according to claim 1, wherein the phase angle determiner is configured to determine said phase angle per delay unit based on a number of said delay units making up each of a series of such relatively-large steps.

6. The circuitry according to claim 1, wherein the phase angle determiner comprises a period determiner configured to determine a representative number representative of the period of the first clock signal based on the successive recorded positions, the representative number being the number of said delay units which collectively provide a propagation delay corresponding to that period.

7. The circuitry according to claim 6, wherein the period determiner is configured to determine said representative number based on, for one or more of the relatively-large steps, the number of said delay units traversed by that step.

8. The circuitry according to claim 7, wherein the period determiner is configured to determine said representative number based on a series of said numbers of said delay units corresponding to a series of such steps.

9. The circuitry according to claim 6, wherein the phase angle determiner is configured to determine the phase angle per delay unit based on said representative number.

10. The circuitry according to claim 1, further comprising a measured phase relationship determiner configured to determine a measured phase relationship between the first and second clock signals at each of a series of said sample times based on the corresponding recorded positions and the phase angle per delay unit.

11. The circuitry according to claim 10, further comprising:
a target phase relationship determiner configured to determine a target phase relationship between the first and second clock signals at each of the or a series of sample times based on those sample times, F1 and F2; and
a phase error determiner configured to determine a phase error between the first and second signals based on the measured phase relationships and the corresponding target phase relationships.

12. Fractional phase-difference detection circuitry or an IC chip or a PLL comprising the circuitry of claim 1.

13. A computer program which, when executed on a computer of circuitry operable based on a first clock signal having an intended clock frequency F1 and a second clock signal having an intended clock frequency F2, causes the circuitry to carry out a method of measuring phase, wherein the circuitry comprises a delay line configured to receive the first clock signal, the delay line comprising a plurality of delay units each configured to cause a propagation delay, and the plurality of delay units connected in series along a length of the delay line and defining a series of positions therebetween through which signal edges of the first clock signal propagate over time, the method comprising:
sampling the delay line at successive sample times based on the second clock signal and recording at each sample time the position of a given signal edge of the first clock signal along the delay line; and
determining a phase angle per delay unit based on successive recorded said positions,
wherein the delay line is sampled every X cycles of the second clock signal,
and wherein X is set so that:
(X*F1)/F2 gives an integer plus fraction result, the fraction of the result indicating a corresponding fraction of a full phase revolution of the first clock signal by which the phase of the first clock signal is expected to advance every X cycles of the second clock signal, the fraction of the full phase revolution of the first clock signal and its complement constituting complementary major and minor portions of the full phase revolution of the first clock signal; and
the fraction of the result is sufficiently larger than 0.5 or sufficiently smaller than 0.5 such that the successive recorded positions follow a repeating pattern, the pattern which repeats comprising the successive recorded positions stepping along the delay line in a given direction in at least 3 relatively-small steps and then returning in an opposite direction via a single relatively-large step, each step traversing consecutive said delay units.

14. Phase measurement circuitry operable based on a first clock signal having an intended clock frequency F1 and a second clock signal having an intended clock frequency F2, the circuitry comprising:
a delay line configured to receive the first clock signal, the delay line comprising a plurality of delay units each configured to cause a propagation delay, and the plurality of delay units connected in series along a length of the delay line and defining a series of positions therebetween through which signal edges of the first clock signal propagate over time;
an edge detector configured to sample the delay line at successive sample times based on the second clock signal and to record at each sample time the position of a given signal edge of the first clock signal along the delay line; and
a phase angle determiner configured to determine a phase angle per delay unit based on successive recorded said positions,
wherein the delay line is configured so that its propagation delay is at least as long as an intended period P1 of the first clock signal or an upper end of a given range of values of the period P1, and optionally shorter than 2 times the intended period P1 or the upper end of the given range of values of the period P1.

15. Phase measurement circuitry operable based on a first clock signal having an intended clock frequency F1 and a second clock signal having an intended clock frequency F2, the circuitry comprising:
a delay line configured to receive the first clock signal, the delay line comprising a plurality of delay units each configured to cause a propagation delay, and the plurality of delay units connected in series along a length of the delay line and defining a series of positions therebetween through which signal edges of the first clock signal propagate over time;
an edge detector configured to sample the delay line at successive sample times based on the second clock signal and to record at each sample time the position of a given signal edge of the first clock signal along the delay line;
a phase angle determiner configured to determine a phase angle per delay unit based on successive recorded said positions;
a measured phase relationship determiner configured to determine a measured phase relationship between the first and second clock signals at each of a series of said sample times based on a corresponding recorded positions and the phase angle per delay unit;

a target phase relationship determiner configured to determine a target phase relationship between the first and second clock signals at each of the or a series of sample times based on those sample times, F1 and F2; and a phase error determiner configured to determine a phase error between the first and second signals based on the measured phase relationships and the corresponding target phase relationships.

* * * * *